(12) United States Patent
Yoshioka et al.

(10) Patent No.: US 9,299,852 B2
(45) Date of Patent: Mar. 29, 2016

(54) SEMICONDUCTOR DEVICE AND METHOD FOR MANUFACTURING THE SAME

(75) Inventors: Kyoko Yoshioka, Kanagawa (JP); Junichi Koezuka, Tochigi (JP); Shinji Ohno, Kanagawa (JP); Yuichi Sato, Kanagawa (JP); Shinya Sasagawa, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 409 days.

(21) Appl. No.: 13/483,078

(22) Filed: May 30, 2012

(65) Prior Publication Data

US 2012/0319100 A1    Dec. 20, 2012

(30) Foreign Application Priority Data

Jun. 16, 2011   (JP) .................. 2011-134236

(51) Int. Cl.
*H01L 21/00*   (2006.01)
*H01L 29/786*  (2006.01)
*H01L 21/324*  (2006.01)
*H01L 29/66*   (2006.01)

(52) U.S. Cl.
CPC .......... *H01L 29/7869* (2013.01); *H01L 21/324* (2013.01); *H01L 29/66969* (2013.01)

(58) Field of Classification Search
CPC ............... H01L 21/02664; H01L 21/02667; H01L 21/02694
USPC ........................... 438/149, 482, 483
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

U.S. Appl. No. 13/453,118, Koezuka et al., Apr. 23, 2012.*

(Continued)

*Primary Examiner* — Samuel Gebremariam
(74) *Attorney, Agent, or Firm* — Eric J. Robinson; Robinson Intellectual Property Law Office, P.C.

(57) ABSTRACT

A miniaturized semiconductor device in which an increase in power consumption is suppressed and a method for manufacturing the semiconductor device are provided. A highly reliable semiconductor device having stable electric characteristics and a method for manufacturing the semiconductor device are provided. An oxide semiconductor film is irradiated with ions accelerated by an electric field in order to reduce the average surface roughness of a surface of the oxide semiconductor film. Consequently, an increase in the leakage current and power consumption of a transistor can be suppressed. Moreover, by performing heat treatment so that the oxide semiconductor film includes a crystal having a c-axis substantially perpendicular to the surface of the oxide semiconductor film, a change in electric characteristics of the oxide semiconductor film due to irradiation with visible light or ultraviolet light can be suppressed.

20 Claims, 20 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,805,807 B2 | 10/2004 | Fenner |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,202,365 B2 | 6/2012 | Umeda et al. |
| 8,389,417 B2 | 3/2013 | Yamazaki et al. |
| 8,779,479 B2 | 7/2014 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2002/0139772 A1 | 10/2002 | Fenner |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0321732 A1 | 12/2009 | Kim et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0114945 A1 | 5/2011 | Yamazaki et al. |
| 2011/0136301 A1 | 6/2011 | Yamazaki et al. |
| 2014/0312346 A1 | 10/2014 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 08-293483 A | 11/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-505867 A | 2/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073558 A | 3/2007 |
| JP | 2009-167087 A | 7/2009 |
| JP | 2010-003822 A | 1/2010 |
| JP | 2010-199456 A | 9/2010 |
| JP | 2011-124557 A | 6/2011 |
| WO | WO-2004/114391 | 12/2004 |
| WO | WO-2011/058913 | 5/2011 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

(56) References Cited

OTHER PUBLICATIONS

Kitzerow.H et al., "Observation of Blue Phases in Chiral Networks", Liquid Crystals, 1993, vol. 14, No. 3, pp. 911-916.

Kimizuka.N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "SUFTLA Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits, 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTs and Their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Lee.M et al., "15.4:Excellent Performance of Indium—Oxide—Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Ohara.H et al., "21.3:4.0 in. QVGA AMOLED Display Using In—Ga—Zn—Oxide TFTs With a Novel Passivation Layer", SID Digest '09 : SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 : SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", Nirim Newsletter, Mar. 1, 1995, vol. 150, pp. 1-4.

Hosono.H et al., "Working hypothesis to explore novel wide band gap electrically conducting amorphous oxides and examples", J. Non-Cryst, Solids (Journal of Non-Crystalline Solids), 1996, vol. 198-200, pp. 165-169.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

(56) References Cited

OTHER PUBLICATIONS

Orita.M et al., "Amorphous transparent conductive oxide InGaO3(ZnO)m (m <4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3-ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline InGaO3(ZnO)5 films", Appl. Phys. Lett. (Applied Physics Letters), Sep. 13, 2004, vol. 85, No. 11, pp. 1993-1995.

Taiwanese Office Action (Application No. 101120142), dated Nov. 20, 2015.

* cited by examiner

FIG. 13A  FIG. 13B
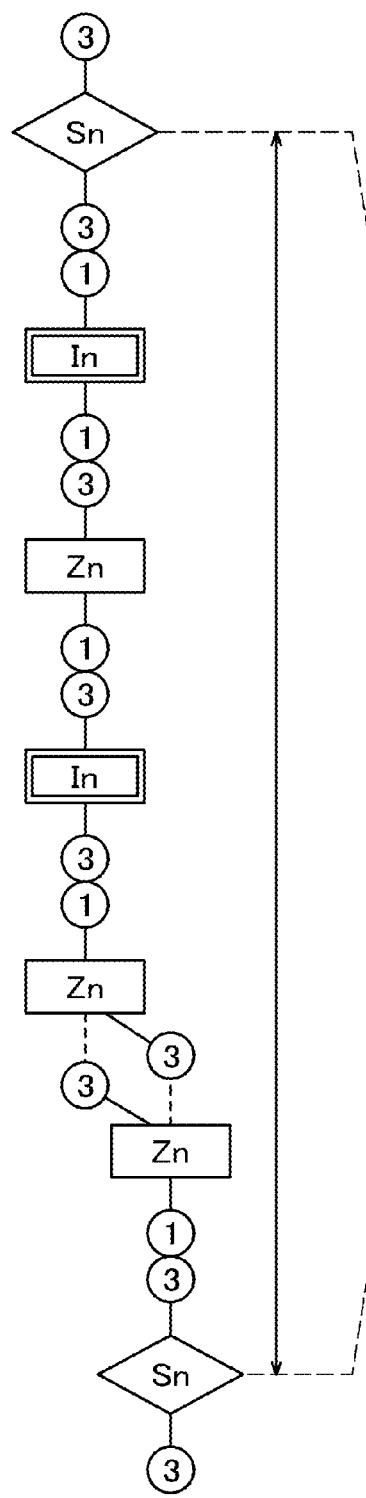
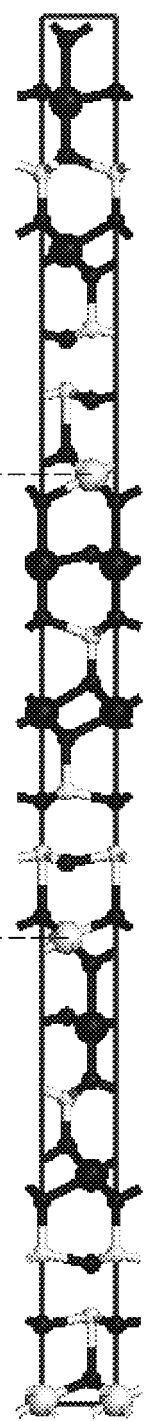
FIG. 13C
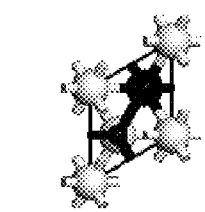
● In
○ Sn
○ Zn
● O

● In
● Ga
● Zn
● O

- In
- Ga or Zn
- O

- In
- Ga
- Zn
- O

SEMICONDUCTOR DEVICE AND METHOD FOR MANUFACTURING THE SAME

BACKGROUND OF THE INVENTION

1. Field of the Invention

The invention disclosed in this specification relates to a semiconductor device using a semiconductor element and a method for manufacturing the semiconductor device.

2. Description of the Related Art

A technique by which a transistor is formed using a semiconductor thin film formed over a substrate having an insulating surface has been attracting attention. Such a transistor is applied to a wide range of electronic devices such as an integrated circuit (IC) or an image display device (display device). A technique in which a wide-gap semiconductor such as an oxide semiconductor is used for a semiconductor thin film that can be applied to a transistor has been attracting attention.

For example, Patent Document 1 discloses that an amorphous oxide semiconductor film including an In—Ga—Zn—O-based oxide can be used for a channel formation region of a thin film transistor.

REFERENCE

Patent Document

[Patent Document 1] Japanese Published Patent Application No. 2004-103957

Miniaturization of a transistor is advanced for higher operation speed, lower power consumption, and higher integration. The above transistor formed using an oxide semiconductor film is not an exception, and is also demanded to be miniaturized to achieve higher operation speed, lower power consumption, and higher integration.

However, a projection or a depression of a top surface of the oxide semiconductor film is not ignorable when the transistor is miniaturized. Particularly in the case where the transistor has a top-gate structure, low planarity of the top surface of the oxide semiconductor film might lead to formation of a portion where coverage with a gate insulating film is locally poor due to the projection or depression of the top surface of the oxide semiconductor film. When the portion where coverage with the gate insulating film is locally poor is formed, there arises a possibility that the leakage current of the transistor is increased and thus the power consumption of the transistor is increased. This possibility is increased as the transistor is miniaturized and the thickness of the gate insulating film is reduced.

Further, electric characteristics of an oxide semiconductor film might change due to irradiation with visible light or ultraviolet light, which is a factor of a change in electric characteristics of a transistor formed using the oxide semiconductor film, resulting in a decrease in the reliability of a semiconductor device.

SUMMARY OF THE INVENTION

In view of the foregoing problems, an object of one embodiment of the invention disclosed herein is to provide a miniaturized semiconductor device in which an increase in power consumption is suppressed and a method for manufacturing the semiconductor device. Another object of one embodiment of the invention disclosed herein is to provide a highly reliable semiconductor device having stable electric characteristics and a method for manufacturing the semiconductor device.

According to one embodiment of the invention disclosed herein, an oxide semiconductor film is irradiated with ions accelerated by an electric field in order to reduce the average surface roughness of a surface of the oxide semiconductor film. Consequently, an increase in the leakage current and power consumption of a transistor formed using the oxide semiconductor film can be suppressed. At this time, the ions are preferably ions of an element that is of the same species as an element contained in the oxide semiconductor film; it is further preferable to use ions of an element that is of the same species as an element having the smallest atomic number of elements contained in the oxide semiconductor film. For example, oxygen ions are preferably used as the ions. Further, according to one embodiment of the invention disclosed herein, heat treatment is performed on the oxide semiconductor film so that the oxide semiconductor film includes a crystal having a c-axis substantially perpendicular to the surface of the oxide semiconductor film. Consequently, a change in electric characteristics of the oxide semiconductor film due to irradiation with visible light or ultraviolet light can be suppressed. More specifically, the following manufacturing method can be employed.

One embodiment of the invention disclosed herein is a method for manufacturing a semiconductor device, which includes the steps of forming an oxide semiconductor film over an insulating surface, irradiating the oxide semiconductor film with an oxygen ion so that the average surface roughness of a surface of the oxide semiconductor film becomes greater than or equal to 0.1 nm and less than or equal to 0.6 nm, forming a gate insulating film over the oxide semiconductor film, forming a gate electrode over the gate insulating film so as to overlap with the oxide semiconductor film, and performing heat treatment on the oxide semiconductor film after the irradiation of the oxide semiconductor film with the oxygen ion so that an oxide semiconductor film including a crystal having a c-axis substantially perpendicular to a surface of the oxide semiconductor film is formed.

In the above method, the irradiation with the oxygen ion is preferably performed by an ion implantation method. The irradiation with the oxygen ion may be performed by an ion doping method. The irradiation with the oxygen ion may be performed by a plasma immersion ion implantation method. Irradiation with a gas cluster ion beam including an oxygen ion may be performed.

Another embodiment of the invention disclosed herein is a method for manufacturing a semiconductor device, which includes the steps of forming an oxide semiconductor film over an insulating surface, irradiating the oxide semiconductor film with a fluorine ion so that the average surface roughness of a surface of the oxide semiconductor film becomes greater than or equal to 0.1 nm and less than or equal to 0.6 nm, forming a gate insulating film over the oxide semiconductor film, forming a gate electrode over the gate insulating film so as to overlap with the oxide semiconductor film, and performing heat treatment on the oxide semiconductor film after the irradiation of the oxide semiconductor film with the fluorine ion so that fluorine is released from the oxide semiconductor film and an oxide semiconductor film including a crystal having a c-axis substantially perpendicular to a surface of the oxide semiconductor film is formed.

In the above method, the irradiation with the fluorine ion is preferably performed by an ion implantation method. The irradiation with the fluorine ion may be performed by an ion doping method. The irradiation with the fluorine ion may be performed by a plasma immersion ion implantation method. Irradiation with a gas cluster ion beam including a fluorine ion may be performed.

Another embodiment of the invention disclosed herein is a method for manufacturing a semiconductor device, which includes the steps of forming an oxide semiconductor film over an insulating surface, performing plasma treatment on the oxide semiconductor film in an oxygen atmosphere so that the average surface roughness of a surface of the oxide semiconductor film becomes greater than or equal to 0.1 nm and less than or equal to 0.6 nm, forming a gate insulating film over the oxide semiconductor film, forming a gate electrode over the gate insulating film so as to overlap with the oxide semiconductor film, and performing heat treatment on the oxide semiconductor film after the plasma treatment of the oxide semiconductor film in the oxygen atmosphere so that an oxide semiconductor film including a crystal having a c-axis substantially perpendicular to a surface of the oxide semiconductor film is formed.

In the above method, the oxide semiconductor film including a crystal preferably includes the crystal having a c-axis substantially perpendicular to the surface of the oxide semiconductor film in a range from the surface of the oxide semiconductor film to 5 nm in depth. The thickness of the gate insulating film is preferably greater than or equal to 5 nm and less than or equal to 15 nm.

Another embodiment of the invention disclosed herein is a semiconductor device including an oxide semiconductor film formed over an insulating surface, a gate insulating film formed over the oxide semiconductor film, and a gate electrode formed over the gate insulating film so as to overlap with the oxide semiconductor film. In the semiconductor device, the average surface roughness of a surface of the oxide semiconductor film is greater than or equal to 0.1 nm and less than or equal to 0.6 nm, and the oxide semiconductor film includes a crystal having a c-axis substantially perpendicular to the surface of the oxide semiconductor film.

In the above semiconductor device, the oxide semiconductor film including a crystal preferably includes the crystal having a c-axis substantially perpendicular to the surface of the oxide semiconductor film in a range from the surface of the oxide semiconductor film to 5 nm in depth. The thickness of the gate insulating film is preferably greater than or equal to 5 nm and less than or equal to 15 nm.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term "electrode" or "wiring" does not limit a function of a component. For example, an "electrode" is sometimes used as part of a "wiring", and vice versa. In addition, the term "electrode" or "wiring" can also mean a combination of a plurality of "electrodes" or "wirings", for example.

Functions of a "source" and a "drain" are sometimes interchanged with each other when a transistor of opposite polarity is used or when the direction of current flow is changed in circuit operation, for example. Therefore, the terms "source" and "drain" can be replaced with each other in this specification.

Note that in this specification and the like, the expression "electrically connected" includes the case where components are connected through an "object having any electric function". There is no particular limitation on the "object having any electric function" as long as electric signals can be transmitted and received between components that are connected through the object.

Examples of the "object having any electric function" are an electrode, a wiring, a switching element such as a transistor, a resistor, an inductor, a capacitor, and an element with a variety of functions.

In this specification and the like, average surface roughness ($R_a$) is obtained by three-dimension expansion of arithmetic mean surface roughness ($R_a$), which is defined by JIS B 0601:2001 (ISO 4287:1997), so that $R_a$ can be applied to a curved surface, and is an average value of the absolute values of deviations from a reference surface to a specific surface.

When the specific surface is expressed as $Z=F(X,Y)$, the average surface roughness ($R_a$) is an average value of the absolute values of deviations from the reference surface to the specific surface and is shown by the following formula.

$$R_a = \frac{1}{S_0} \int_{Y_1}^{Y_2} \int_{X_1}^{X_2} |F(X, Y) - Z_0| \, dX \, dY \qquad \text{[FORMULA 1]}$$

Here, the specific surface is a surface which is a target of roughness measurement, and is a quadrilateral region which is specified by four points represented by the coordinates $(X_1,Y_1,F(X_1,Y_1))$, $(X_1,Y_2,F(X_1,Y_2))$, $(X_2,Y_1,F(X_2,Y_1))$, and $(X_2,Y_2,F(X_2,Y_2))$.

In addition, $S_0$ represents the area of a rectangle which is obtained by projecting the specific surface on the XY plane, and $Z_0$ represents the height of the reference surface (the average height of the specific surface). The average surface roughness ($R_a$) can be measured using an atomic force microscope (AFM).

According to one embodiment of the invention disclosed herein, a miniaturized semiconductor device in which an increase in power consumption is suppressed and a method for manufacturing the semiconductor device can be provided. According to one embodiment of the invention disclosed herein, a highly reliable semiconductor device having stable electric characteristics and a method for manufacturing the semiconductor device can be provided.

BRIEF DESCRIPTION OF THE DRAWINGS

In the accompanying drawings:

FIGS. 13A to 13C illustrate structures of an oxide material;

DETAILED DESCRIPTION OF THE INVENTION

Figure 1A:
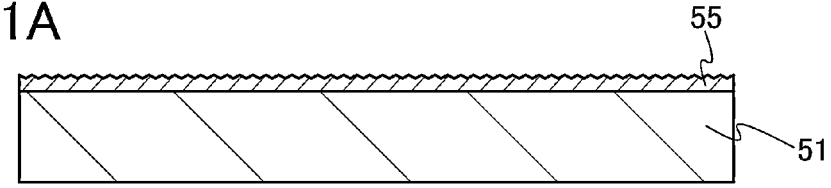
FIGS. 1A to 1E are cross-sectional views illustrating a manufacturing process of a semiconductor device according to one embodiment of the present invention.

Hereinafter, embodiments and an example of the present invention will be described with reference to the drawings. Note that the present invention is not limited to the following description and it will be easily understood by those skilled in the art that modes and details of the present invention can be modified in various ways without departing from the spirit and scope thereof. Therefore, the present invention should not be construed as being limited to the description in the following embodiments and example. Note that in the following embodiments and example, the same portions or portions having similar functions are denoted by the same reference numerals in different drawings, and explanation thereof will not be repeated.

Note that the position, size, range, or the like of each structure illustrated in drawings and the like is not accurately represented in some cases for easy understanding. Therefore, the invention disclosed herein is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Embodiment 1

In this embodiment, as embodiments according to the present invention, a transistor formed using an oxide semiconductor film and a method for manufacturing the transistor will be described with reference to FIGS. 1A to 1E.

FIGS. 1A to 1E are cross-sectional views illustrating a manufacturing process of a top-gate transistor 100 which is one embodiment of a structure of a semiconductor device.

The manufacturing process of the transistor 100 will be described below with reference to FIGS. 1A to 1E.

First, an oxide semiconductor film 55 is formed over a substrate 51 as illustrated in FIG. 1A. The oxide semiconductor film 55 can be formed by a sputtering method, a molecular beam epitaxy method, an atomic layer deposition method, a pulsed laser deposition method, or the like, while the substrate 51 is heated. The thickness of the oxide semiconductor film 55 is greater than or equal to 2 nm and less than or equal to 200 nm, preferably greater than or equal to 5 nm and less than or equal to 100 nm, further preferably greater than or equal to 5 nm and less than or equal to 30 nm.

Although there is no particular limitation on a substrate that can be used as the substrate 51, the substrate preferably has an insulating surface and needs to have at least heat resistance high enough to withstand heat treatment performed later. For example, a glass substrate of aluminosilicate glass, aluminoborosilicate glass, barium borosilicate glass, or the like; a ceramic substrate; a quartz substrate; or a sapphire substrate can be used. Alternatively, a single crystal semiconductor substrate or a polycrystalline semiconductor substrate of silicon, silicon carbide, or the like; a compound semiconductor substrate of silicon germanium or the like; or the like can be used. Further alternatively, a substrate obtained by forming an insulating layer over a surface of a semiconductor substrate of silicon or the like or a surface of a conductive substrate formed of a metal material can be used.

Note that a base insulating film may be provided between the substrate 51 and the oxide semiconductor film 55. Here, the base insulating film is preferably formed using an oxide insulating film from which part of oxygen is released by heat treatment. The oxide insulating film from which part of oxygen is released by heat treatment is preferably an oxide insulating film which contains oxygen at a proportion higher than that in the stoichiometric composition. By using the oxide insulating film from which part of oxygen is released by heat treatment as the base insulating film, oxygen can be diffused into the oxide semiconductor film 55 by heat treatment in a subsequent step. Typical examples of the oxide insulating film from which part of oxygen is released by heat treatment include films of silicon oxide, silicon oxynitride, aluminum oxide, aluminum oxynitride, gallium oxide, hafnium oxide, and yttrium oxide. Diffusion of oxygen enables a reduction in oxygen vacancies in the oxide semiconductor film 55 formed over the base insulating film and at an interface between the base insulating film and the oxide semiconductor film 55.

In addition, the base insulating film does not necessarily contain oxygen, and a nitride insulating film may be formed using silicon nitride, aluminum nitride, or the like. Further, the base insulating film may have a stacked structure including the oxide insulating film and the nitride insulating film; in that case, the oxide insulating film is preferably provided over the nitride insulating film. By using the nitride insulating film as the base insulating film, entry of an alkali metal or the like into the oxide semiconductor film 55 can be prevented when a glass substrate containing an impurity such as an alkali metal is used as the substrate 51. Since an alkali metal such as lithium, sodium, or potassium is an adverse impurity for the oxide semiconductor, the amount of such an alkali metal contained in the oxide semiconductor film is preferably small. The nitride insulating film can be formed by a CVD method, a sputtering method, or the like.

An oxide semiconductor used for the oxide semiconductor film 55 preferably contains at least indium (In) or zinc (Zn). In particular, In and Zn are preferably contained. As a stabilizer for reducing variation in electric characteristics of a transistor formed using the oxide semiconductor, gallium (Ga) is preferably contained in addition to In and Zn. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

In this embodiment, the oxide semiconductor film 55 is formed by a sputtering method.

As a target for a sputtering method, any of the following can be used for example: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

In the case where an In—Ga—Zn—O-based material is used as an oxide semiconductor, the atomic ratio of metal elements in a target to be used may be In:Ga:Zn=1:1:1, 1:3:2, 4:2:3, 3:1:2, 1:1:2, 2:1:3, 3:1:4, or the like. An In—Ga—Zn-based oxide having such an atomic ratio or an oxide whose composition is in the neighborhood of the above compositions can be used as the target. When the target has any of the above composition ratios, a polycrystal or a c-axis aligned crystal (CAAC) described later is likely to be formed.

In the case where an In—Sn—Zn—O-based material is used as an oxide semiconductor, the atomic ratio of metal elements in a target to be used may be In:Sn:Zn=1:1:1, 2:1:3, 1:2:2, 20:45:35, or the like. An In—Sn—Zn-based oxide having such an atomic ratio or an oxide whose composition is in the neighborhood of the above compositions can be used as the target. When the target has any of the above composition ratios, a polycrystal or a CAAC described later is likely to be formed.

In the case where an In—Zn—O-based material is used as an oxide semiconductor, the atomic ratio of metal elements in a target to be used is In:Zn=50:1 to 1:2 in an atomic ratio ($In_2O_3$:ZnO=25:1 to 1:4 in a molar ratio), preferably In:Zn=20:1 to 1:1 in an atomic ratio ($In_2O_3$:ZnO=10:1 to 1:2 in a molar ratio), further preferably In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>1.5X+Y is satisfied. An In—Zn—O-based oxide having such an atomic ratio or an oxide whose composition is in the neighborhood of the above compositions can be used as the target.

However, without limitation to the materials given above, a material with an appropriate composition may be used in accordance with needed semiconductor characteristics (e.g., mobility, threshold voltage, and variation). In order to obtain the needed semiconductor characteristics, it is preferable that the carrier density, the impurity concentration, the defect density, the atomic ratio between a metal element and oxygen, the bond distance, the density, and the like be set to appropriate values.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide containing In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \le r^2$, and r may be 0.05, for example. The same applies to other oxides.

As a sputtering gas, a rare gas (typically argon), oxygen, or a mixed gas of a rare gas and oxygen is used as appropriate. In the case of using the mixed gas of a rare gas and oxygen, the proportion of oxygen is preferably higher than that of a rare gas. Further, in order to prevent hydrogen, water, a hydroxyl group, a hydride, and the like from entering the oxide semiconductor film, a high-purity gas from which impurities such as hydrogen, water, a hydroxyl group, and a hydride are sufficiently removed is preferably used as the sputtering gas.

In a sputtering method, an RF power supply device, an AC power supply device, a DC power supply device, or the like can be used as appropriate as a power supply device for generating plasma.

Note that the leakage rate of a treatment chamber in which the oxide semiconductor film is formed is preferably set to be lower than or equal to $1 \times 10^{-10}$ Pa·m$^3$/s, whereby entry of impurities into the film during the formation by a sputtering method can be reduced. As described above, in the step of forming the oxide semiconductor film and preferably also in the step of forming the oxide insulating film, entry of impurities is suppressed as much as possible through control of the pressure of the treatment chamber, the leakage rate of the treatment chamber, and the like, whereby entry of impurities including hydrogen into the oxide semiconductor film can be reduced. In addition, diffusion of impurities such as hydrogen from the oxide insulating film into the oxide semiconductor film can be reduced.

Note that the oxide semiconductor film 55 may have a single crystal structure or a non-single-crystal structure. In the latter case, the oxide semiconductor film 55 may have either an amorphous structure or a polycrystalline structure. Further, the oxide semiconductor film 55 may have either an amorphous structure including a portion having crystallinity or a non-amorphous structure.

In the case where the oxide semiconductor film 55 has an amorphous structure, the substrate is not heated or the substrate is heated so that the substrate temperature is lower than 200° C., preferably lower than 180° C., in the formation of the oxide semiconductor film 55. The oxide semiconductor film 55 is formed in this manner, whereby the oxide semiconductor film 55 can have an amorphous structure.

As the oxide semiconductor film 55, a c-axis aligned crystalline oxide semiconductor (CAAC-OS) film including a crystallized portion may be used. Note that the CAAC-OS film will be described in detail later.

In the case where the oxide semiconductor film 55 is the CAAC-OS film, the substrate is heated so that the substrate temperature in the formation of the oxide semiconductor film 55 is higher than 200° C. and lower than or equal to 700° C., preferably higher than 300° C. and lower than or equal to 500° C., further preferably higher than or equal to 400° C. and lower than or equal to 450° C. The oxide semiconductor film 55 is formed while the substrate is heated in this manner, whereby the oxide semiconductor film 55 can be the CAAC-OS film.

However, a surface of the oxide semiconductor film 55 formed in the above manner may possibly have low planarity and a projection or a depression. Therefore, in the case where a top-gate transistor is manufactured using the oxide semiconductor film 55, a portion where coverage with a gate insulating film formed over and in contact with the oxide semiconductor film 55 is locally poor might be formed. When the portion where coverage with the gate insulating film is locally poor is formed, there arises a possibility that the leakage current of the transistor is increased and thus the power consumption of the transistor is increased. This possibility is increased as the transistor is miniaturized and the thickness of the gate insulating film is reduced.

Figure 1B:
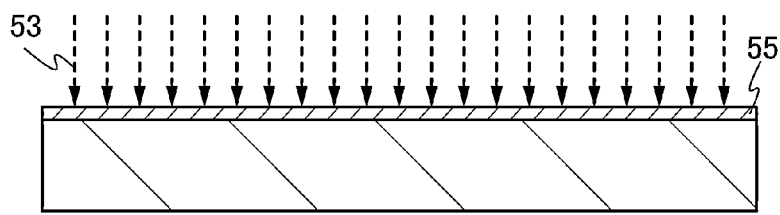

To solve the problem, the oxide semiconductor film 55 is irradiated with ions 53 (which include at least an ion and may include a radical or a molecule) accelerated by an electric field as illustrated in FIG. 1B, whereby the planarity of the surface of the oxide semiconductor film 55 is improved. Here, that treatment is performed so that the average surface roughness of the surface of the oxide semiconductor film 55 becomes less than 1 nm, preferably greater than or equal to 0.1 nm and less than or equal to 0.6 nm, further preferably greater than or equal to 0.2 nm and less than or equal to 0.5 nm.

The ions 53 are preferably ions of an element that is of the same species as an element contained in the oxide semiconductor film 55; it is further preferable to use ions of an element that is of the same species as an element having the smallest atomic number of elements contained in the oxide semiconductor film 55. For example, oxygen ions may be used as the ions 53; in this case, the ions 53 may include an oxygen radical or an oxygen molecule.

Note that in the case where ions of an element that is of the same species as a metal element contained in the oxide semiconductor film 55 are used as the ions 53, the composition ratio of a target for formation of the oxide semiconductor film 55 needs to be set in consideration of the metal element added to the oxide semiconductor film 55 by irradiation with the ions 53.

For improvement in the planarity of the oxide semiconductor film 55 by irradiation with the ions 53, an ion implantation method, an ion doping method, a plasma immersion ion implantation (PIII) method, or the like can be used. Further, the planarity of the oxide semiconductor film 55 may be improved by irradiation with a gas cluster ion beam (GCIB) including the ions 53.

In an ion implantation method in this embodiment, a source gas is made into plasma, ion species included in this plasma are extracted and mass-separated, and ion species with predetermined mass are accelerated and implanted into an object as an ion beam.

In an ion doping method in this embodiment, a source gas is made into plasma, ion species included in this plasma are extracted and accelerated by an electric field without mass separation, and an object is irradiated with the ion species, whereby elements in the ion species are contained in the object.

In this embodiment, a plasma immersion ion implantation method is also referred to as a plasma source ion implantation (PSII) method or a plasma based ion implantation (PBII) method. In this method, high-voltage pulses are applied to an object placed in plasma, whereby ions in the plasma are accelerated and absorbed into the object. Since the plasma is generated to cover the entire surface of the object, irradiation with ions can be performed three-dimensionally, not only from one surface side.

In addition, a gas cluster ion beam refers to a beam obtained in such a manner that a large number of atoms, molecules, or the like are gathered to form a cluster, are ionized, and are accelerated. When a high-pressure gas is ejected into a vacuum, the gas is rapidly cooled due to adiabatic expansion, so that a gas cluster is generated. By ionizing the gas cluster and applying an electric field thereto, the ionized gas cluster can be accelerated. Gas cluster ions delivered to an object are added to a shallow region in a substrate, and part of the gas cluster ions scatter in parallel to the substrate surface. Projections over the substrate can be preferentially removed by the gas cluster ions scattering in parallel to the substrate surface; thus, the substrate surface can be planarized. This phenomenon is sometimes called a lateral sputtering effect.

In this embodiment, the planarity of the surface of the oxide semiconductor film 55 is improved by an ion implantation method using oxygen ions as the ions 53. Here, in the ion implantation method, it is preferable that the accelerating voltage be 5 kV to 100 kV and the dose be $5.0 \times 10^{14}$ ions/cm$^2$ to $5.0 \times 10^{16}$ ions/cm$^2$. For example, conditions of an accelerating voltage of 10 kV and a dose of $1.0 \times 10^{16}$ ions/cm$^2$ can be employed. Note that conditions of the ion implantation method, such as accelerating voltage and dose, are not limited thereto and may be set as appropriate in accordance with the thickness of the oxide semiconductor film 55, or the like.

The planarity of the oxide semiconductor film 55 may be improved by plasma treatment in an oxygen atmosphere instead of irradiation with the ions 53. The plasma treatment is preferably performed using oxygen plasma generated by an inductively coupled plasma (ICP) method, a capacitively coupled plasma (CCP) method, an electron cyclotron resonance (ECR) method, or the like. In this embodiment, the plasma treatment is performed by an ICP method. For example, the following conditions can be employed: the oxygen flow rate is 75 sccm, the pressure in a treatment chamber is 1.5 Pa, the substrate temperature is 70° C., the processing time is 60 seconds, the frequency of an RF power supply is 13.56 MHz, the ICP power is 800 W, and the bias power is 300 W. Note that conditions of the plasma treatment are not limited thereto and may be set as appropriate in accordance with desired conditions.

By the above method, the planarity of the surface of the oxide semiconductor film 55 is improved so that the average surface roughness of the oxide semiconductor film 55 becomes less than 1 nm, preferably greater than or equal to 0.1 nm and less than or equal to 0.6 nm, further preferably greater than or equal to 0.2 nm and less than or equal to 0.5 nm.

By improving the planarity of the surface of the oxide semiconductor film 55 in this manner so that projections and depressions are reduced, it is possible to reduce the possibility that, in the case where a top-gate transistor is manufactured using the oxide semiconductor film 55, a portion where coverage with a gate insulating film formed over and in contact with the oxide semiconductor film 55 is locally poor is formed. Accordingly, even when the thickness of the gate insulating film is reduced for miniaturization of the transistor, an increase in the leakage current and power consumption of the transistor can be prevented. In other words, a miniaturized transistor in which an increase in power consumption is suppressed can be manufactured.

Further, in the case where oxygen ions are used as the ions 53 in the above method for improving the planarity of the surface of the oxide semiconductor film 55, the oxygen ions are added to the oxide semiconductor film 55. As a result, oxygen can be supplied to the oxide semiconductor film 55 and an oxygen vacancy in the oxide semiconductor film 55 can be filled. Also in the case where oxygen is contained between lattices in the oxide semiconductor film 55, an oxygen vacancy in the oxide semiconductor film 55 can be filled with the oxygen by heat treatment in a subsequent step.

In this embodiment, the planarity of the oxide semiconductor film 55 is improved by irradiation with, as the ions 53, ions of an element that is of the same species as an element contained in the oxide semiconductor film 55; the invention disclosed in this embodiment is not limited thereto. Irradiation with, as the ions 53, ions of an element that is of a species different from that of an element contained in the oxide semiconductor film 55 may be performed. Note that such an element that is of a species different from that of an element contained in the oxide semiconductor film 55 acts as an impurity in the oxide semiconductor film; therefore, it is preferable to use an element that is releasable in a subsequent step, for example, by heat treatment. For example, irradiation with fluorine ions as the ions 53 is preferably performed. For the irradiation with fluorine ions, an ion implantation method, an ion doping method, a plasma immersion ion implantation method, or the like can be used. Further, the planarity of the oxide semiconductor film 55 may be improved by irradiation with a gas cluster ion beam including fluorine ions. Instead of fluorine ions, helium ions may be used.

Fluorine or helium can be relatively easily released from the oxide semiconductor film 55 by heat treatment; therefore, even when added to the oxide semiconductor film 55 for improvement in the planarity thereof, fluorine or helium can be released without being left as an impurity in the oxide semiconductor film 55.

Note that in the case where the oxide semiconductor film 55 is formed in the step illustrated in FIG. 1A to have a structure having crystallinity, such as a single crystal structure or a polycrystalline structure, the structure having crystallinity might be broken by the irradiation with the ions 53 in FIG. 1B.

Figure 1C:
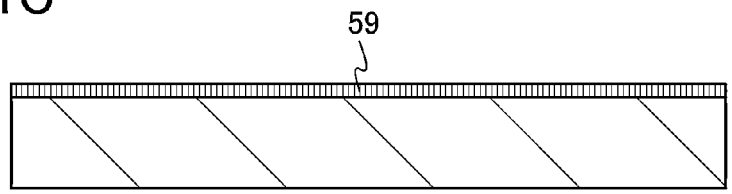

In that case, heat treatment is performed on the oxide semiconductor film 55 as illustrated in FIG. 1C; thus, a crystalline oxide semiconductor film 59 including a crystal having a c-axis substantially perpendicular to a film surface is formed.

The heat treatment is performed at a temperature higher than or equal to 250° C. and lower than or equal to 700° C., preferably higher than or equal to 400° C. and lower than or equal to 700° C., further preferably higher than or equal to 500° C. and lower than or equal to 700° C., still further preferably higher than or equal to 550° C. and lower than or equal to 700° C. Consequently, at least part of the oxide semiconductor film 55, which has been broken by the irradiation with the ions 53, is crystallized, so that the crystalline oxide semiconductor film 59 including a crystal having a c-axis substantially perpendicular to the film surface can be formed. Note that the heat treatment can be performed in an inert gas atmosphere, in an oxygen gas atmosphere, or in a vacuum. The inert gas atmosphere is preferably an atmosphere which contains nitrogen or a rare gas (such as helium, neon, or argon) as a main component and does not contain water, hydrogen, and the like. For example, the purity of nitrogen or a rare gas such as helium, neon, or argon introduced into a heat treatment apparatus is higher than or equal to 6N (99.9999%), preferably higher than or equal to 7N (99.99999%) (that is, the impurity concentration is lower than or equal to 1 ppm, preferably lower than or equal to 0.1 ppm).

The heat treatment can be performed in such a manner that, for example, the substrate 51 is introduced into an electric furnace using a resistance heating element or the like, and then heated at 650° C. for 1 hour in a nitrogen atmosphere.

The heat treatment apparatus is not limited to the electric furnace and may be an apparatus for heating an object to be processed by thermal conduction or thermal radiation from a medium such as a heated gas. For example, a rapid thermal annealing (RTA) apparatus such as a lamp rapid thermal annealing (LRTA) apparatus or a gas rapid thermal annealing (GRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas.

Such heat treatment can further remove a substance containing a hydrogen atom included in the crystalline oxide semiconductor film 59; thus, a structure of the crystalline oxide semiconductor film 59 can be improved and defect levels in the energy gap can be reduced. Since hydrogen or water contained in the crystalline oxide semiconductor film 59 is removed in this manner, the heat treatment can also be referred to as dehydration or dehydrogenation. Note that the heat treatment for dehydration or dehydrogenation is not necessarily performed as heat treatment for formation of the crystalline oxide semiconductor film 59, and may be performed before the heat treatment for formation of the crystalline oxide semiconductor film 59 or after formation of the crystalline oxide semiconductor film 59. In the case of being performed before the crystalline oxide semiconductor film 59 is formed, the dehydration or dehydrogenation is preferably performed at such a temperature as to prevent formation of a crystal in the oxide semiconductor film 55.

The crystalline oxide semiconductor film 59 includes a crystal having a c-axis substantially perpendicular to the surface of the crystalline oxide semiconductor film 59, and is also referred to as a CAAC-OS film. Note that in this specification and the like, the expression "substantially perpendicular" means not only a strictly perpendicular angle but also angles ranging from greater than or equal to 85° to less than or equal to 95°, for example.

The CAAC-OS film is an oxide semiconductor film including a crystal with c-axis alignment which has a triangular or hexagonal atomic arrangement when seen from the direction of an a-b plane, a surface, or an interface. In the crystal, metal atoms are arranged in a layered manner along a c-axis, or metal atoms and oxygen atoms are arranged in a layered manner along a c-axis, and the direction of the a-axis or the b-axis is varied in the a-b plane (or the surface or the interface) (the crystal rotates around the c-axis).

In a broad sense, a CAAC-OS means a non-single-crystal oxide semiconductor including a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS film is not a single crystal, but this does not mean that the CAAC-OS film is composed of only an amorphous component. In other words, the CAAC-OS film is an oxide semiconductor film having a crystal-amorphous mixed phase structure in which a crystalline portion exists in an amorphous phase. Although the CAAC-OS film includes a crystallized portion (crystalline portion), a boundary between one crystalline portion and another crystalline portion is not clear in some cases. For example, an image observed with a transmission electron microscope (TEM) does not clearly show a boundary between an amorphous portion and a crystalline portion in the CAAC-OS film. Further, with the TEM, a grain boundary in the CAAC-OS film is not found. Thus, in the CAAC-OS film, a reduction in electron mobility, due to the grain boundary, is suppressed.

Nitrogen may be substituted for part of oxygen contained in the CAAC-OS film. The c-axes of individual crystalline portions included in the CAAC-OS film may be aligned in one direction (e.g., the direction perpendicular to a surface of a substrate over which the CAAC-OS film is formed, a surface of the CAAC-OS film, or an interface of the CAAC-OS film). Alternatively, normals of the a-b planes of individual crystalline portions included in the CAAC-OS film may be aligned in one direction (e.g., the direction perpendicular to the substrate surface or the surface or interface of the CAAC-OS film).

Examples of a crystal structure included in the CAAC-OS film will be described in detail with reference to FIGS. 12A to 12E, FIGS. 13A to 13C, FIGS. 14A to 14C, and FIGS. 15A and 15B. In FIGS. 12A to 12E, FIGS. 13A to 13C, FIGS. 14A to 14C, and FIGS. 15A and 15B, the vertical direction corresponds to the c-axis direction and a plane perpendicular to the c-axis direction corresponds to the a-b plane, unless otherwise specified. When the expressions "upper half" and "lower half" are simply used, they refer to an upper half above the a-b plane and a lower half below the a-b plane (an upper half and a lower half with respect to the a-b plane). Furthermore, in FIGS. 12A to 12E, O surrounded by a circle represents tetracoordinate O and O surrounded by a double circle represents tricoordinate O.

Figure 12A:
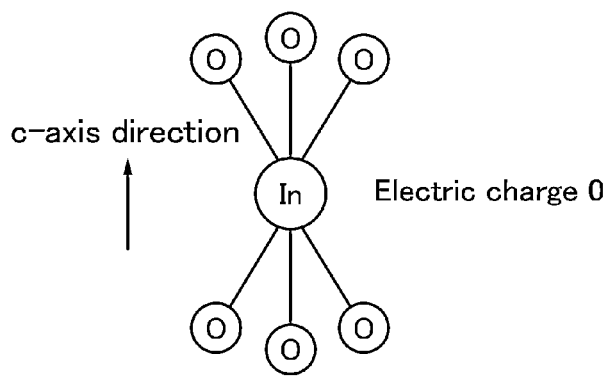
FIGS. 12A to 12E each illustrate a structure of an oxide material.

FIG. 12A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 12A is actually an octahedral structure, but is illustrated as a planar structure for simplicity. Note that three tetracoordinate O atoms exist in each of an upper half and a lower half in FIG. 12A. In the small group illustrated in FIG. 12A, electric charge is 0.

Figure 12D:
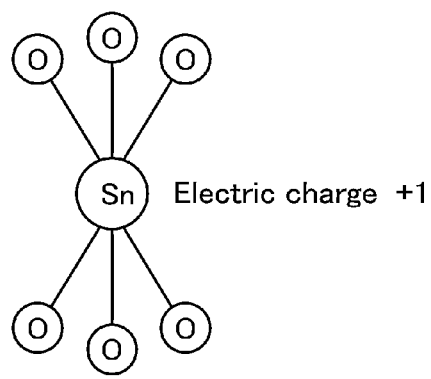
Figure 12B:
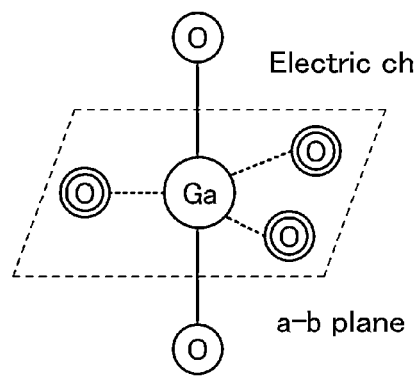

FIG. 12B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 12B. An In atom can also have the structure illustrated in FIG. 12B because an In atom can have five ligands. In the small group illustrated in FIG. 12B, electric charge is 0.

Figure 12E:
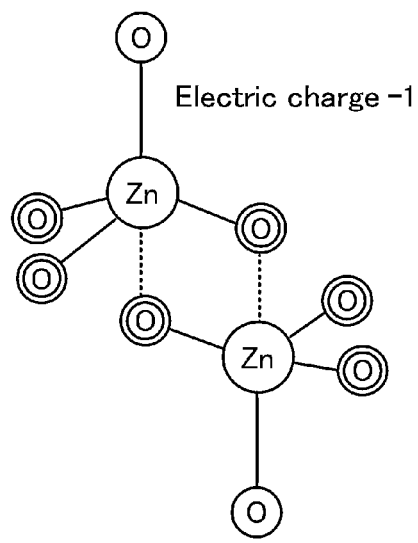
Figure 12C:
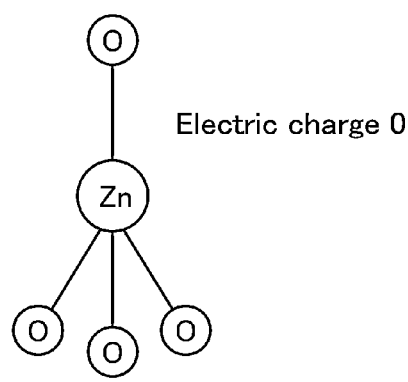

FIG. 12C illustrates a structure including one tetracoordinate Zn atom and four tetracoordinate O atoms proximate to the Zn atom. In FIG. 12C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 12C. In the small group illustrated in FIG. 12C, electric charge is 0.

FIG. 12D illustrates a structure including one hexacoordinate Sn atom and six tetracoordinate O atoms proximate to the Sn atom. In FIG. 12D, three tetracoordinate O atoms exist in each of an upper half and a lower half. In the small group illustrated in FIG. 12D, electric charge is +1.

FIG. 12E illustrates a small group including two Zn atoms. In FIG. 12E, one tetracoordinate O atom exists in each of an upper half and a lower half. In the small group illustrated in FIG. 12E, electric charge is −1.

Here, a plurality of small groups forms a medium group, and a plurality of medium groups forms a large group (also referred to as a unit cell).

Now, a rule of bonding between the small groups will be described. The three O atoms in the upper half with respect to the hexacoordinate In atom in FIG. 12A each have three proximate In atoms in the downward direction, and the three O atoms in the lower half each have three proximate In atoms in the upward direction. The one O atom in the upper half with respect to the pentacoordinate Ga atom in FIG. 12B has one proximate Ga atom in the downward direction, and the one O atom in the lower half has one proximate Ga atom in the upward direction. The one O atom in the upper half with respect to the tetracoordinate Zn atom in FIG. 12C has one proximate Zn atom in the downward direction, and the three O atoms in the lower half each have three proximate Zn atoms in the upward direction. In this manner, the number of tetracoordinate O atoms above a metal atom is equal to the number of metal atoms proximate to and below each of the tetracoordinate O atoms. Similarly, the number of tetracoordinate O atoms below a metal atom is equal to the number of metal atoms proximate to and above each of the tetracoordinate O atoms. Since the coordination number of the tetracoordinate O atom is 4, the sum of the number of metal atoms proximate to and below the O atom and the number of metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

FIG. 13A illustrates a model of a medium group included in a layered structure of an In—Sn—Zn—O-based material. FIG. 13B illustrates a large group including three medium groups. Note that FIG. 13C illustrates an atomic arrangement in the case where the layered structure in FIG. 13B is observed from the c-axis direction.

In FIG. 13A, a tricoordinate O atom is omitted for simplicity, and a tetracoordinate O atom is illustrated by a circle; the number in the circle shows the number of tetracoordinate O atoms. For example, three tetracoordinate O atoms existing in each of an upper half and a lower half with respect to a Sn atom are denoted by circled 3. Similarly, in FIG. 13A, one tetracoordinate O atom existing in each of an upper half and a lower half with respect to an In atom is denoted by circled 1. FIG. 13A also illustrates a Zn atom proximate to one tetracoordinate O atom in a lower half and three tetracoordinate O atoms in an upper half, and a Zn atom proximate to one tetracoordinate O atom in an upper half and three tetracoordinate O atoms in a lower half.

In the medium group included in the layered structure of the In—Sn—Zn—O-based material in FIG. 13A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 12E can be given. For example, with one small group including two Zn atoms, electric charge of one small group including a Sn atom can be cancelled, so that the total electric charge of the layered structure can be 0.

When the large group illustrated in FIG. 13B is repeated, an In—Sn—Zn—O-based crystal ($In_2SnZn_3O_8$) can be obtained. Note that a layered structure of the obtained In—Sn—Zn—O-based crystal can be expressed as a composition formula, $In_2SnZn_2O_7(ZnO)_m$ (m is 0 or a natural number).

The above rule also applies to the following oxides: a four-component metal oxide such as an In—Sn—Ga—Zn—O-based oxide; a three-component metal oxide such as an In—Ga—Zn—O-based oxide (also referred to as IGZO), an In—Al—Zn—O-based oxide, a Sn—Ga—Zn—O-based oxide, an Al—Ga—Zn—O-based oxide, a Sn—Al—Zn—O-based oxide, an In—Hf—Zn—O-based oxide, an In—La—Zn—O-based oxide, an In—Ce—Zn—O-based oxide, an In—Pr—Zn—O-based oxide, an In—Nd—Zn—O-based oxide, an In—Sm—Zn—O-based oxide, an In—Eu—Zn—O-based oxide, an In—Gd—Zn—O-based oxide, an In—Tb—Zn—O-based oxide, an In—Dy—Zn—O-based oxide, an In—Ho—Zn—O-based oxide, an In—Er—Zn—O-based oxide, an In—Tm—Zn—O-based oxide, an In—Yb—Zn—O-based oxide, or an In—Lu—Zn—O-based oxide; a two-component metal oxide such as an In—Zn—O-based oxide, a Sn—Zn—O-based oxide, an Al—Zn—O-based oxide, a Zn—Mg—O-based oxide, a Sn—Mg—O-based oxide, an In—Mg—O-based oxide, or an In—Ga—O-based oxide; and the like.

Figure 14A:
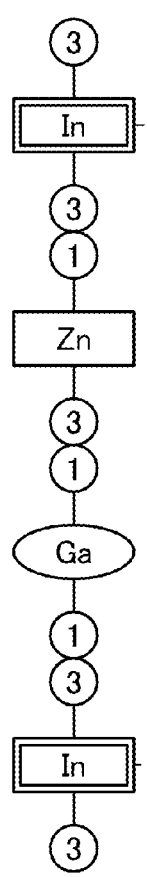
FIGS. 14A to 14C illustrate structures of an oxide material.

As an example, FIG. 14A illustrates a model of a medium group included in a layered structure of an In—Ga—Zn—O-based material.

In the medium group included in the layered structure of the In—Ga—Zn—O-based material in FIG. 14A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 14B:
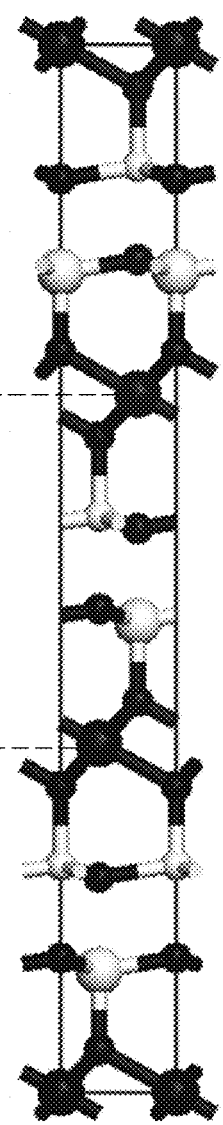
Figure 14C:
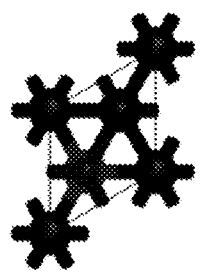

FIG. 14B illustrates a large group including three medium groups. Note that FIG. 14C illustrates an atomic arrangement in the case where the layered structure in FIG. 14B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, and +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 14A but also a medium group in which the arrangement of the In atom, the Ga atom, and the Zn atom is different from that in FIG. 14A.

When the large group illustrated in FIG. 14B is repeated, an In—Ga—Zn—O-based crystal can be obtained. Note that a layered structure of the obtained In—Ga—Zn—O-based crystal can be expressed as a composition formula, $InGaO_3(ZnO)_n$ (n is a natural number).

Figure 15A:
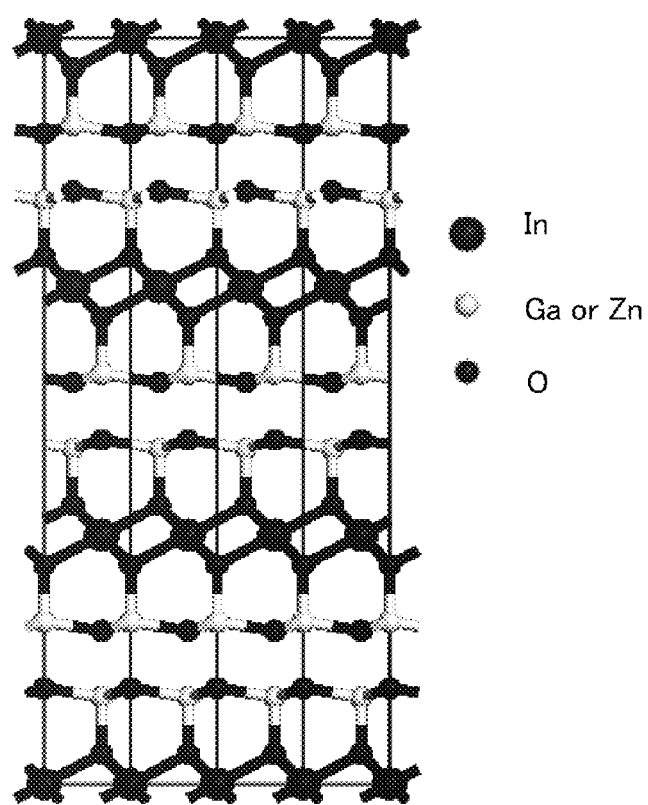
FIGS. 15A and 15B each illustrate a structure of an oxide material.

In the case where n=1 ($InGaZnO_4$), a crystal structure illustrated in FIG. 15A can be obtained, for example. Note that in the crystal structure in FIG. 15A, since a Ga atom and an In atom each have five ligands as described with reference to FIG. 12B, a structure in which Ga is replaced with In can be obtained.

Figure 15B:
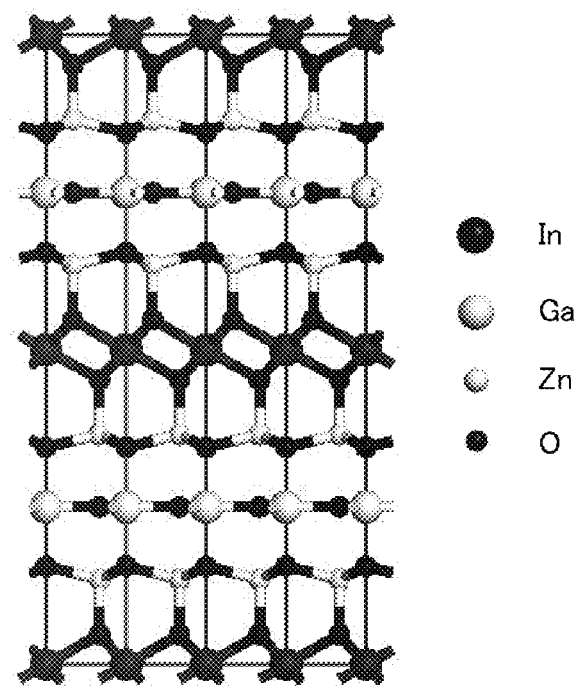

In the case where n=2 ($InGaZn_2O_5$), a crystal structure illustrated in FIG. 15B can be obtained, for example. Note that in the crystal structure in FIG. 15B, since a Ga atom and an In atom each have five ligands as described with reference to FIG. 12B, a structure in which Ga is replaced with In can be obtained.

The crystalline oxide semiconductor film 59 including such a CAAC includes a crystal having a c-axis substantially perpendicular to the surface of the crystalline oxide semiconductor film 59 preferably in a range from the surface to approximately 2 nm to 5 nm in depth. Thus, in the case where a top-gate transistor is formed using the crystalline oxide semiconductor film 59, the surface of the crystalline oxide semiconductor film 59, that is, a region including the crystal having a c-axis substantially perpendicular to the surface of the crystalline oxide semiconductor film 59 can be used as a channel formation region.

As described above, the crystalline oxide semiconductor film 59 including a crystal having a c-axis substantially perpendicular to the surface of the crystalline oxide semiconductor film 59 has a certain level or more of crystallinity, which is favorable as compared with that of an entirely amorphous oxide semiconductor film; therefore, oxygen vacancies, dangling bonds, hydrogen bonded to dangling bonds or the like, and impurities containing hydrogen such as water, a hydroxyl group, and a hydride are reduced. These impurities function as sources for supplying carriers in the oxide semiconductor film, which might change the electric conductivity of the oxide semiconductor film. Here, electric characteristics of the crystalline oxide semiconductor film 59, in which these impurities are reduced, are stable; therefore, a change in electric characteristics due to irradiation with visible light or ultraviolet light can be suppressed. Accordingly, a highly reliable semiconductor device having stable electric characteristics can be provided.

Moreover, since the planarity of the surface of the crystalline oxide semiconductor film 59 is improved in the above step, crystals having c-axes substantially perpendicular to the surface of the crystalline oxide semiconductor film 59 are formed in a layered manner along the surface. A continuous growth face of the crystals having the c-axes is formed in the crystalline oxide semiconductor film 59, so that the crystallinity of the crystalline oxide semiconductor film 59 is improved. In contrast, if crystals having c-axes substantially perpendicular to the surface of the oxide semiconductor film 55 having low surface planarity as in FIG. 1A are formed along the surface, the crystals are formed in a layered manner along the surface with projections and depressions and thus a growth face is discontinuous, which results in low crystallinity of the oxide semiconductor film 55. Therefore, higher mobility can be obtained in a transistor formed using the crystalline oxide semiconductor film 59 than in a transistor formed using the oxide semiconductor film 55 having the surface with projections and depressions.

In this embodiment, the crystalline oxide semiconductor film 59 is formed by performing heat treatment immediately after planarization of the oxide semiconductor film 55; one embodiment of the present invention is not limited thereto. The formation of the crystalline oxide semiconductor film 59 by heat treatment may be performed any time after the oxide semiconductor film 55 is planarized, for example, after a gate insulating film described later is formed or after a protective insulating film of the transistor 100 is formed.

Further, by forming a CAAC-OS film as the oxide semiconductor film 55, the crystalline oxide semiconductor film 59 can be easily formed to be a CAAC-OS film by the above heat treatment; therefore, it is preferable that a CAAC-OS film be formed at a stage of forming the oxide semiconductor film 55.

In the case where the planarity of the oxide semiconductor film 55 is improved by irradiation with ions of an element such as fluorine or helium, which is of a species different from that of an element contained in the oxide semiconductor film 55, the element used in irradiation can be released from the crystalline oxide semiconductor film 59 by the heat treatment for formation of the crystalline oxide semiconductor film 59.

In addition, it is preferable that after the oxide semiconductor film 55 is heated by the heat treatment, a high-purity oxygen gas, a high-purity $N_2O$ gas, or ultra-dry air (the amount of moisture is less than or equal to 20 ppm (−55° C. by conversion into a dew point), preferably less than or equal to 1 ppm, further preferably less than or equal to 10 ppb, when measured with a dew point meter of a cavity ring down laser spectroscopy (CRDS) system) be introduced into the same furnace. It is preferable that water, hydrogen, and the like be not contained in these gases in particular. The purity of the oxygen gas or the $N_2O$ gas that is introduced into the furnace is preferably higher than or equal to 6N, further preferably higher than or equal to 7N (that is, the impurity concentration is preferably lower than or equal to 1 ppm, further preferably lower than or equal to 0.1 ppm). By the action of the oxygen gas or the $N_2O$ gas, oxygen, which is one of main components of the oxide semiconductor and has been decreased through the step of removing impurities by dehydration or dehydrogenation, can be supplied.

Next, the crystalline oxide semiconductor film 59 is etched into an island shape, and a source electrode 61a and a drain electrode 61b are formed in contact with the crystalline oxide semiconductor film 59.

A mask used in the etching of the crystalline oxide semiconductor film 59 can be formed as appropriate by a photolithography process, an inkjet method, a printing method, or the like. Wet etching or dry etching may be employed as appropriate for the etching of the crystalline oxide semiconductor film 59.

The source electrode 61a and the drain electrode 61b can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains one or more metal elements selected from aluminum, titanium, tantalum, tungsten, molybdenum, chromium, neodymium, and scandium may be used. The source electrode 61a and the drain electrode 61b may have a single-layer structure or a stacked-structure including two or more layers. For example, a single-layer structure of an aluminum film containing silicon, a two-layer structure in which a copper film is stacked over a Cu—Mg—Al alloy film, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used.

The source electrode 61a and the drain electrode 61b can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to employ a stacked structure formed using the above light-transmitting conductive material and the above metal element.

After a conductive film is formed by a sputtering method, a CVD method, an evaporation method, or the like, a mask is formed over the conductive film and the conductive film is etched, and thereby the source electrode 61a and the drain electrode 61b are formed. The mask formed over the conductive film can be formed by a printing method, an inkjet method, or a photolithography method as appropriate. Alternatively, the source electrode 61a and the drain electrode 61b can be directly formed by a printing method or an inkjet method.

Here, the conductive film is formed over the crystalline oxide semiconductor film 59 and the substrate 51 and then is etched into a predetermined shape, so that the source electrode 61a and the drain electrode 61b which are in contact with at least part of a top surface and side surfaces of the crystalline oxide semiconductor film 59 are formed. At this time, in some cases, a region which is in the crystalline oxide semiconductor film 59 and overlaps with neither the source electrode 61a nor the drain electrode 61b is etched and a depression is formed in the crystalline oxide semiconductor film 59.

Note that the island-shaped crystalline oxide semiconductor film 59, the source electrode 61a, and the drain electrode 61b may be formed in such a manner that a conductive film is formed over the crystalline oxide semiconductor film 59, and the crystalline oxide semiconductor film 59 and the conductive film are etched using a multi-tone photomask. A concavo-convex shaped mask is formed, the crystalline oxide semiconductor film 59 and the conductive film are etched using the concavo-convex shaped mask, the concavo-convex shaped mask is divided by ashing, and the conductive film is selectively etched using the divided mask, whereby the island-shaped crystalline oxide semiconductor film 59, the source electrode 61a, and the drain electrode 61b can be formed. In this process, the number of the photomasks and the number of steps in photolithography can be reduced.

Figure 1D:
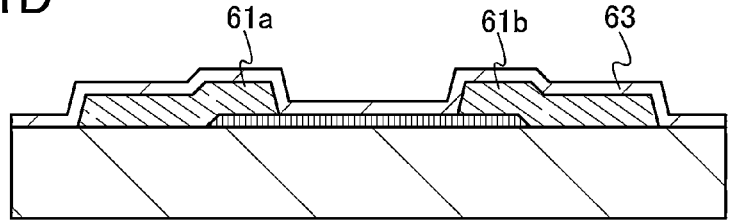

Then, a gate insulating film 63 is formed over the crystalline oxide semiconductor film 59, the source electrode 61a, and the drain electrode 61b as illustrated in FIG. 1D.

The gate insulating film 63 can be formed to have a single-layer or stacked structure using one or more of silicon oxide, silicon oxynitride, silicon nitride, silicon nitride oxide, aluminum oxide, aluminum oxynitride, and gallium oxide.

Here, since the planarity of the crystalline oxide semiconductor film 59 is improved in the above step so that the average surface roughness of the film becomes less than 1 nm, preferably greater than or equal to 0.1 nm and less than or equal to 0.6 nm, further preferably greater than or equal to 0.2 nm and less than or equal to 0.5 nm, it is possible to reduce the thickness of the gate insulating film 63 easily in order to miniaturize a transistor formed using the crystalline oxide semiconductor film 59. The thickness of the gate insulating film 63 is preferably greater than or equal to 5 nm and less than or equal to 200 nm, further preferably greater than or equal to 5 nm and less than or equal to 15 nm. Since the planarity of the crystalline oxide semiconductor film 59 is improved, the possibility that a portion where coverage with the gate insulating film 63 is locally poor is formed can be reduced even when the gate insulating film 63 has such a small thickness. Accordingly, an increase in the leakage current and power consumption of the transistor can be prevented. In other words, a miniaturized transistor in which an increase in power consumption is suppressed can be manufactured.

In addition, the gate insulating film 63 preferably contains oxygen. Further, the gate insulating film 63 is preferably formed using an oxide insulating film from which part of oxygen is released by heat treatment. The oxide insulating film from which part of oxygen is released by heat treatment is preferably an oxide insulating film which contains oxygen at a proportion higher than that in the stoichiometric composition. The oxide insulating film containing oxygen can be formed using silicon oxide, silicon oxynitride, aluminum oxide, aluminum oxynitride, gallium oxide, or the like. By using the oxide insulating film from which part of oxygen is released by heat treatment, oxygen can be diffused into the crystalline oxide semiconductor film 59 by heat treatment in a subsequent step and the transistor 100 can have favorable characteristics.

When the gate insulating film 63 is formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, gate leakage current can be reduced. Further, a structure can be employed in which a high-k material and one or more of silicon oxide, silicon oxynitride, silicon nitride, silicon nitride oxide, aluminum oxide, aluminum oxynitride, and gallium oxide are stacked.

Figure 1E:
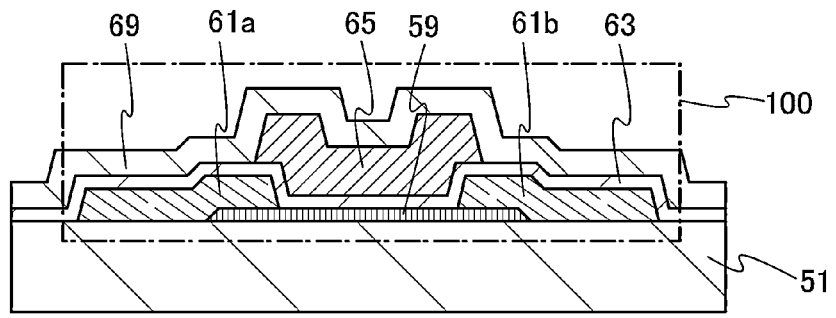

Next, a gate electrode 65 is formed over the gate insulating film 63 so as to overlap with the crystalline oxide semiconductor film 59 as illustrated in FIG. 1E.

The gate electrode 65 can be formed using a metal element selected from aluminum, chromium, copper, tantalum, titanium, molybdenum, tungsten, manganese, and zirconium; an alloy containing any of these metal elements as a component; an alloy containing any of these metal elements in combination; or the like. Alternatively, an alloy film or a nitride film which contains one or more metal elements selected from aluminum, titanium, tantalum, tungsten, molybdenum, chromium, neodymium, and scandium may be used. Further, the gate electrode 65 may have a single-layer structure or a stacked structure including two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film, or a three-layer structure in which a titanium film, an aluminum film, and a titanium film are stacked in this order can be used.

The gate electrode 65 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. In addition, a compound conductor obtained by sputtering using an In—Ga—Zn—O-based metal oxide as a target in an atmosphere containing nitrogen may be used. It is also possible to employ a stacked structure formed using the above light-transmitting conductive material and the above metal element.

It is further preferable that an insulating film 69 be formed as a protective film over the gate electrode 65 as illustrate in FIG. 1E.

The insulating film 69 can be formed as appropriate with the use of an insulating film similar to the gate insulating film 63. In particular, when an aluminum oxide film, a silicon nitride film, a silicon oxynitride film, or the like is formed as the insulating film 69 by a sputtering method, entry of moisture and an alkali metal from the outside can be prevented, and thus the amount of impurities contained in the crystalline oxide semiconductor film 59 can be reduced. The insulating film formed as the insulating film 69 may be a single layer or a stack of plural layers.

Note that after the gate insulating film 63 is formed or after the insulating film 69 is formed, heat treatment may be performed in an inert gas atmosphere or an oxygen atmosphere. The temperature of the heat treatment is preferably higher than or equal to 200° C. and lower than or equal to 450° C., further preferably higher than or equal to 250° C. and lower than or equal to 350° C. By performing such heat treatment, variation in electric characteristics of the transistor can be reduced. Further, in the case where the gate insulating film 63 or the insulating film 69 contains oxygen, oxygen can be supplied to the crystalline oxide semiconductor film 59, and an oxygen vacancy in the crystalline oxide semiconductor film 59 can be filled. In the case where the insulating film 69 includes an aluminum oxide film or the like, release of oxygen from the insulating film 69 by the heat treatment can be suppressed, and thus oxygen can be supplied to the crystalline oxide semiconductor film 59 more efficiently. As described above, the heat treatment has an effect of supplying oxygen; therefore, the heat treatment can also be referred to as supply of oxygen.

As described above, impurities such as hydrogen are removed by dehydration or dehydrogenation and an oxygen vacancy is filled by supply of oxygen, whereby the crystalline oxide semiconductor film 59 which is of i-type (intrinsic) or substantially i-type can be formed. Thus, the off-state current characteristics of the transistor 100 can be quite excellent.

In this embodiment, although the heat treatment for supply of oxygen is performed after the crystalline oxide semiconductor film 59 is formed, one embodiment of the present invention is not limited thereto; the crystalline oxide semiconductor film 59 may be formed through the heat treatment for supply of oxygen.

Through the above steps, the transistor 100 having the crystalline oxide semiconductor film 59 in a channel formation region can be manufactured. As illustrated in FIG. 1E, the transistor 100 includes the crystalline oxide semiconductor film 59 formed over the substrate 51 having an insulating surface, the source electrode 61a and the drain electrode 61b formed in contact with the crystalline oxide semiconductor film 59, the gate insulating film 63 formed over the crystalline oxide semiconductor film 59, the gate electrode 65 formed over the gate insulating film 63 so as to overlap with the crystalline oxide semiconductor film 59, and the insulating film 69 formed over the gate electrode 65. The transistor 100 includes the i-type (intrinsic) or substantially i-type crystalline oxide semiconductor film 59, and therefore exhibits quite excellent characteristics.

As described above, by improving the planarity of the surface of the oxide semiconductor film so that projections and depressions are reduced, it is possible to reduce the possibility that, in the case where a top-gate transistor is manufactured using the oxide semiconductor film, a portion where coverage with a gate insulating film formed over and in contact with the oxide semiconductor film is locally poor is formed. Accordingly, even when the thickness of the gate insulating film is reduced for miniaturization of the transistor, an increase in the leakage current and power consumption of the transistor can be prevented. In other words, a miniaturized transistor in which an increase in power consumption is suppressed can be manufactured.

Moreover, electric characteristics of the oxide semiconductor film including a crystal having a c-axis substantially perpendicular to the film surface are stable; therefore, a change in electric characteristics due to irradiation with visible light or ultraviolet light can be suppressed. Accordingly, a highly reliable semiconductor device having stable electric characteristics can be provided.

Further, since the planarity of the surface of the oxide semiconductor film is improved, crystals having c-axes substantially perpendicular to the film surface are formed in a layered manner along the surface. A continuous growth face of the crystals having the c-axes is formed in the oxide semiconductor film, so that the crystallinity of the oxide semiconductor film is improved. Accordingly, higher mobility can be obtained in a transistor formed using the oxide semiconductor film.

The structures, methods, and the like described in this embodiment can be combined as appropriate with any of the structures, methods, and the like described in the other embodiments.

Embodiment 2

In this embodiment, a method for manufacturing a transistor having a structure different from that of the transistor described in Embodiment 1 will be described with reference to FIGS. 2A to 2E, FIGS. 3A to 3E, FIGS. 4A to 4E, and FIGS. 5A to 5C.

A manufacturing process of a transistor 110 will be described with reference to FIGS. 2A to 2E.

Figure 2A:
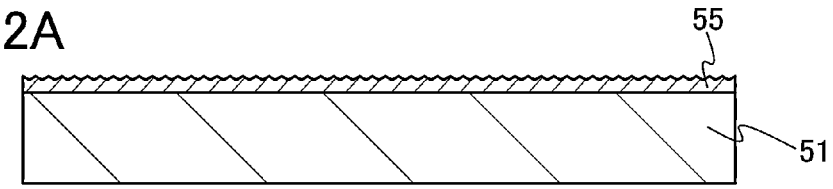
FIGS. 2A to 2E are cross-sectional views illustrating a manufacturing process of a semiconductor device according to one embodiment of the present invention.

First, as in the above embodiment, the oxide semiconductor film 55 is formed over the substrate 51 as illustrated in FIG. 2A. The description for FIG. 1A in the above embodiment can be referred to for details.

Figure 2B:
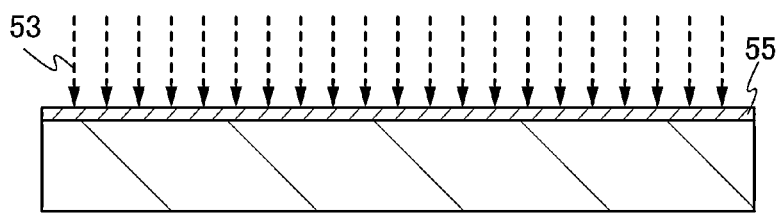

Next, as in the above embodiment, the oxide semiconductor film 55 is irradiated with the ions 53 (which include at least an ion and may include a radical or a molecule) as illustrated in FIG. 2B, whereby the planarity of a surface of the oxide semiconductor film 55 is improved. The description for FIG. 1B in the above embodiment can be referred to for details.

Figure 2C:
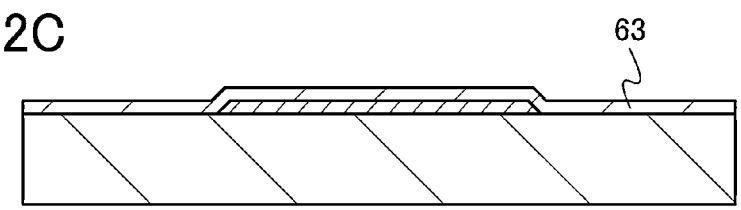

Next, as illustrated in FIG. 2C, the oxide semiconductor film 55 is etched into an island shape, and the gate insulating film 63 is formed over the island-shaped oxide semiconductor film 55. Here, the description in the above embodiment can be referred to for the method for etching the oxide semiconductor film 55 and the method for forming the gate insulating film.

In this embodiment, the gate insulating film 63 is formed before crystallization of the oxide semiconductor film 55, which is different from the above embodiment. Needless to say, the oxide semiconductor film 55 may be heated to be crystallized before formation of the gate insulating film 63 as in the above embodiment. In addition, as described in the above embodiment, heat treatment for dehydration or dehydrogenation may be performed as appropriate.

Figure 2D:
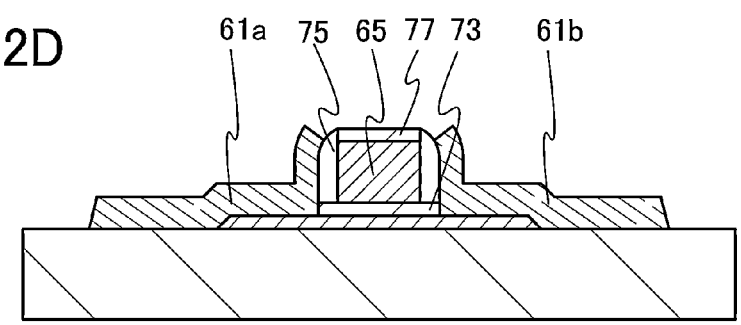

Next, as illustrated in FIG. 2D, the gate electrode 65 is formed over the gate insulating film 63 so as to overlap with the oxide semiconductor film 55, an insulating film 77 is formed over the gate electrode 65, and a sidewall insulating film 75 is formed in contact with side surfaces of the insulating film 77 and side surfaces of the gate electrode 65. The description in the above embodiment can be referred to for the method for forming the gate electrode 65. The insulating film 77 is provided to prevent a short circuit between the gate electrode 65 and another wiring and can be formed by a method similar to that for the gate insulating film 63.

The sidewall insulating film 75 may be formed to have a single-layer or stacked structure using one or more of silicon oxide, silicon oxynitride, silicon nitride oxide, silicon nitride, aluminum oxide, aluminum oxynitride, aluminum nitride oxide, aluminum nitride, and the like. The sidewall insulating film 75 may be formed using an oxide insulating film from which part of oxygen is released by heat treatment as in the case of the gate insulating film 63.

A method for forming the sidewall insulating film 75 is described below.

First, an insulating film which is to be the sidewall insulating film 75 is formed over the gate insulating film 63 and the gate electrode 65. The insulating film is formed by a sputtering method, a CVD method, or the like. There is no particular limitation on the thickness of the insulating film, and the thickness is selected as appropriate in consideration of coverage with respect to the shape of the gate electrode 65. Then, the sidewall insulating film 75 is formed by etching the insulating film. The etching here is highly anisotropic etching, and the sidewall insulating film 75 can be formed in a self-aligned manner by performing the highly anisotropic etching on the insulating film.

Next, as illustrated in FIG. 2D, a portion which is in the gate insulating film 63 and overlaps with neither the gate electrode 65 nor the sidewall insulating film 75 is selectively etched, so that a gate insulating film 73 is formed. As an etching method here, either dry etching or wet etching may be employed. Further, the gate insulating film 73 may be formed concurrently with the sidewall insulating film 75.

Then, the source electrode 61a and the drain electrode 61b which are in contact with at least part of a top surface and side surfaces of the oxide semiconductor film 55 are formed. The description in the above embodiment can be referred to for the method for forming the source electrode 61a and the drain electrode 61b. Note that the source electrode 61a and the drain electrode 61b are preferably formed in contact with side surfaces of the sidewall insulating film 75 and side surfaces of the gate insulating film 73. In other words, it is preferable that the source electrode 61a and the drain electrode 61b be located over the sidewall insulating film 75 and entirely cover exposed portions of the oxide semiconductor film 55.

Figure 2E:
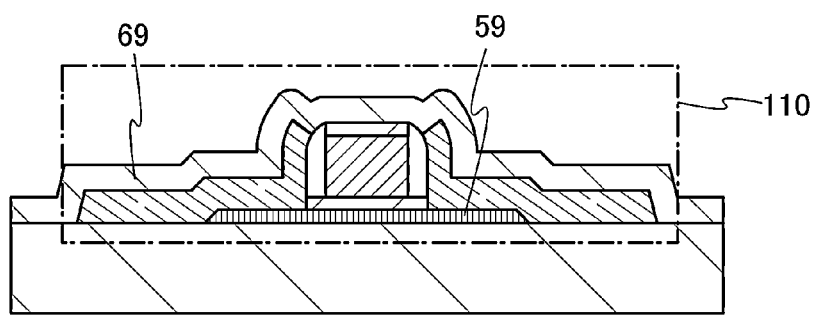

Next, as illustrated in FIG. 2E, the insulating film 69 is formed as a protective film over the gate electrode 65, the sidewall insulating film 75, the source electrode 61a, and the drain electrode 61b. The description in the above embodiment can be referred to for the method for forming the insulating film 69.

Further, heat treatment is performed after the formation of the insulating film 69, whereby the crystalline oxide semiconductor film 59 can be formed. The heat treatment can also serve as heat treatment for supply of oxygen, by which oxygen is supplied to the crystalline oxide semiconductor film 59. The description in the above embodiment can be referred to for the heat treatment.

Through the above steps, the transistor 110 having the crystalline oxide semiconductor film 59 in a channel formation region can be manufactured.

A manufacturing process of a transistor 120 will be described with reference to FIGS. 3A to 3E.

Figure 3A:
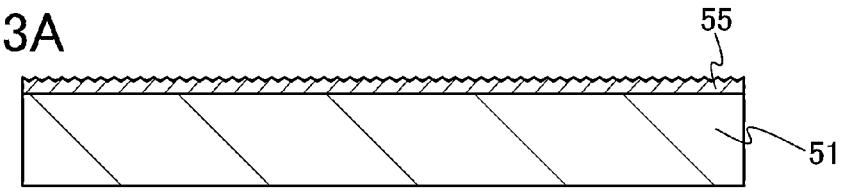
FIGS. 3A to 3E are cross-sectional views illustrating a manufacturing process of a semiconductor device according to one embodiment of the present invention.

First, as in the above embodiment, the oxide semiconductor film 55 is formed over the substrate 51 as illustrated in FIG. 3A. The description for FIG. 1A in the above embodiment can be referred to for details.

Figure 3B:
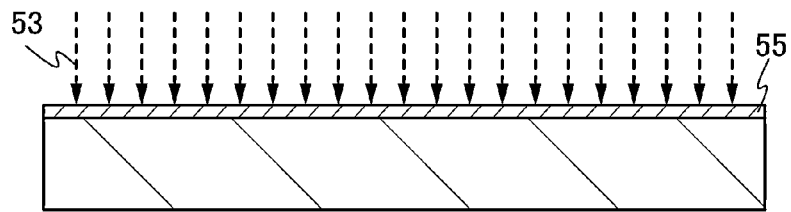

Next, as in the above embodiment, the oxide semiconductor film 55 is irradiated with the ions 53 (which include at least an ion and may include a radical or a molecule) as illustrated in FIG. 3B, whereby the planarity of a surface of the oxide semiconductor film 55 is improved. The description for FIG. 1B in the above embodiment can be referred to for details.

Figure 3C:
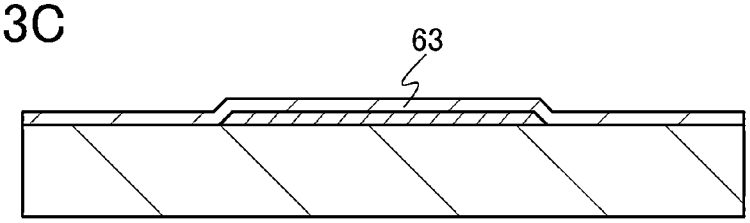

Next, as illustrated in FIG. 3C, the oxide semiconductor film 55 is etched into an island shape, and the gate insulating film 63 is formed over the island-shaped oxide semiconductor film 55. For details, the above description for FIG. 2C can be referred to.

Figure 3D:
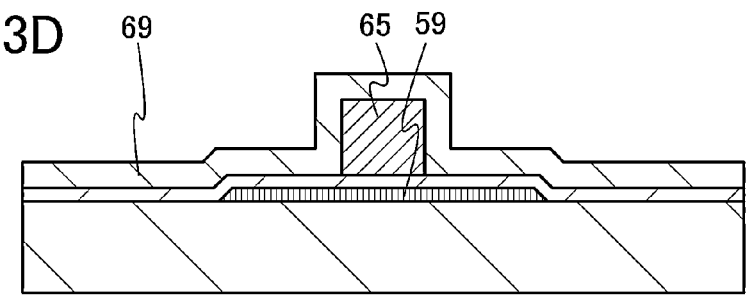

Next, as illustrated in FIG. 3D, the gate electrode 65 is formed over the gate insulating film 63 so as to overlap with the oxide semiconductor film 55, and the insulating film 69 is formed as a protective film over the gate electrode 65. The description in the above embodiment can be referred to for the methods for forming the gate electrode 65 and the insulating film 69.

Further, heat treatment is performed after the formation of the insulating film 69, whereby the crystalline oxide semiconductor film 59 can be formed. The heat treatment can also serve as heat treatment for supply of oxygen, by which oxygen is supplied to the crystalline oxide semiconductor film 59. The description in the above embodiment can be referred to for the heat treatment.

Figure 3E:
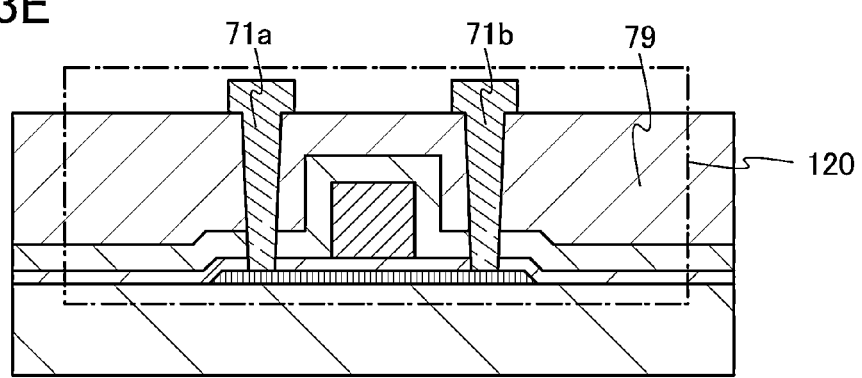

Next, as illustrated in FIG. 3E, an insulating film 79 functioning as a planarization insulating film is formed over the insulating film 69. The insulating film 79 can be formed using an organic insulating material having heat resistance, such as an acrylic resin, polyimide, a benzocyclobutene-based resin, polyamide, or an epoxy resin. In addition to such organic insulating materials, it is possible to use a low-dielectric constant material (a low-k material), a siloxane based resin, phosphosilicate glass (PSG), borophosphosilicate glass (BPSG), or the like. Note that the planarization insulating film may be formed by stacking a plurality of insulating films formed using any of these materials.

Then, openings reaching the crystalline oxide semiconductor film 59 are formed in the insulating film 79, the insulating film 69, and the gate insulating film 63, and a source electrode 71a and a drain electrode 71b are formed over the insulating film 79 so as to be in contact with the crystalline oxide semiconductor film 59 through the openings. The source electrode 71a and the drain electrode 71b can be formed by a method similar to that for the source electrode 61a and the drain electrode 61b, and thus the description in the above embodiment can be referred to.

Through the above steps, the transistor 120 having the crystalline oxide semiconductor film 59 in a channel formation region can be manufactured.

A manufacturing process of a transistor 130 will be described with reference to FIGS. 4A to 4E.

Figure 4A:
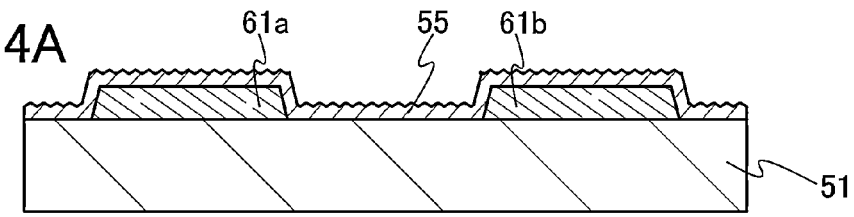
FIGS. 4A to 4E are cross-sectional views illustrating a manufacturing process of a semiconductor device according to one embodiment of the present invention.

First, the source electrode 61a and the drain electrode 61b are formed over the substrate 51 as illustrated in FIG. 4A. The description in the above embodiment can be referred to for the method for forming the source electrode 61a and the drain electrode 61b.

Next, as illustrated in FIG. 4A, the oxide semiconductor film 55 is formed over the substrate 51, the source electrode 61a, and the drain electrode 61b. The description for FIG. 1A in the above embodiment can be referred to for details.

Figure 4B:
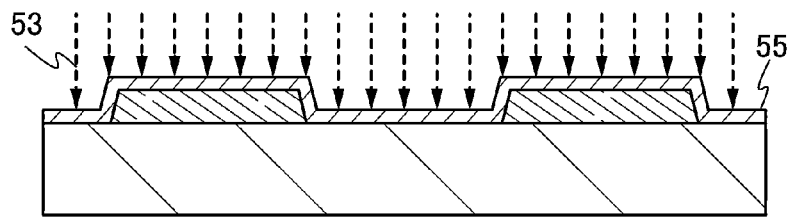

Next, as in the above embodiment, the oxide semiconductor film 55 is irradiated with the ions 53 (which include at least an ion and may include a radical or a molecule) as illustrated in FIG. 4B, whereby the planarity of a surface of the oxide semiconductor film 55 is improved. The description for FIG. 1B in the above embodiment can be referred to for details. Here, that treatment is performed so that the average surface roughness of the surface of the oxide semiconductor film 55 becomes less than 1 nm, preferably greater than or equal to 0.1 nm and less than or equal to 0.6 nm, further preferably greater than or equal to 0.2 nm and less than or equal to 0.5 nm. Note that this is not applied to a step portion of the oxide semiconductor film, which overlaps with the source electrode 61a or the drain electrode 61b.

Figure 4C:
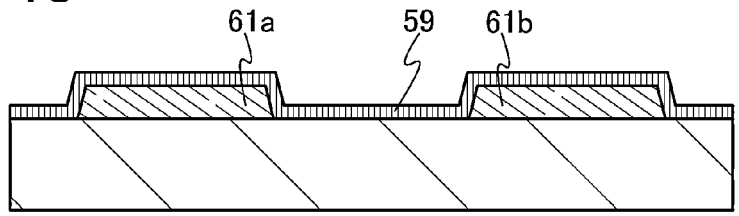

Next, heat treatment is performed on the oxide semiconductor film 55 as illustrated in FIG. 4C; thus, the crystalline oxide semiconductor film 59 is formed. The description for FIG. 1C in the above embodiment can be referred to for details. In addition, as described in the above embodiment, heat treatment for dehydration or dehydrogenation may be performed as appropriate.

Figure 4D:
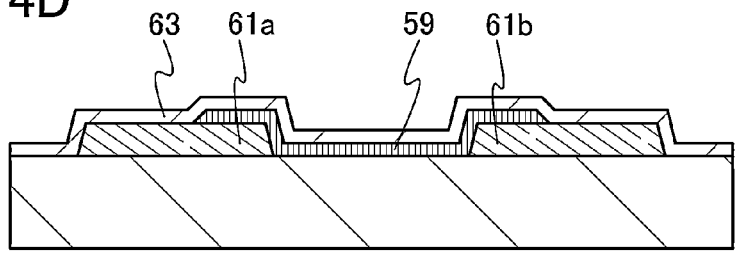

Next, as illustrated in FIG. 4D, the crystalline oxide semiconductor film 59 is etched into an island shape, and the gate insulating film 63 is formed over the island-shaped crystalline oxide semiconductor film 59. For details, the above description for FIG. 2C can be referred to.

Figure 4E:
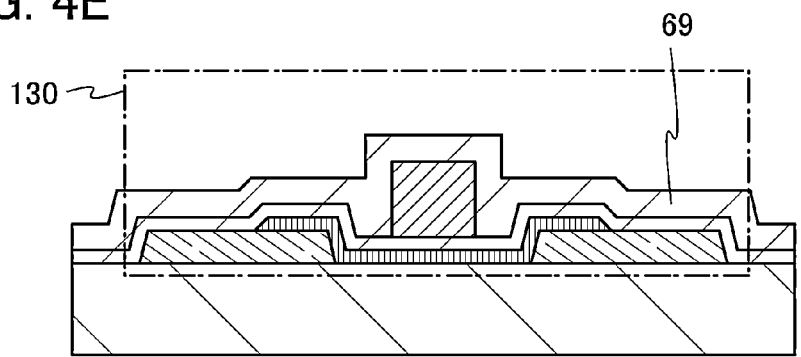

Next, as illustrated in FIG. 4E, the gate electrode 65 is formed over the gate insulating film 63 so as to overlap with the crystalline oxide semiconductor film 59, and the insulating film 69 is formed as a protective film over the gate electrode 65. The description in the above embodiment can be referred to for the methods for forming the gate electrode 65 and the insulating film 69.

Further, heat treatment is performed after the formation of the insulating film 69; thus, heat treatment for supply of oxygen, by which oxygen is supplied to the crystalline oxide semiconductor film 59, is performed. The description in the above embodiment can be referred to for the heat treatment.

Through the above steps, the transistor 130 which has the crystalline oxide semiconductor film 59 in a channel formation region and in which the crystalline oxide semiconductor film 59 is in contact with part of top surfaces and part of side surfaces of the source electrode 61a and the drain electrode 61b can be manufactured.

Figure 5A:
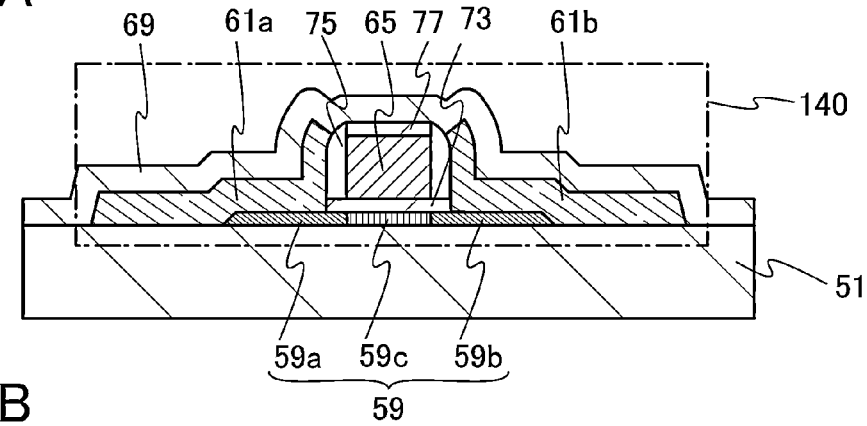
FIGS. 5A to 5C are each a cross-sectional view illustrating a semiconductor device according to one embodiment of the present invention.
Figure 5B:
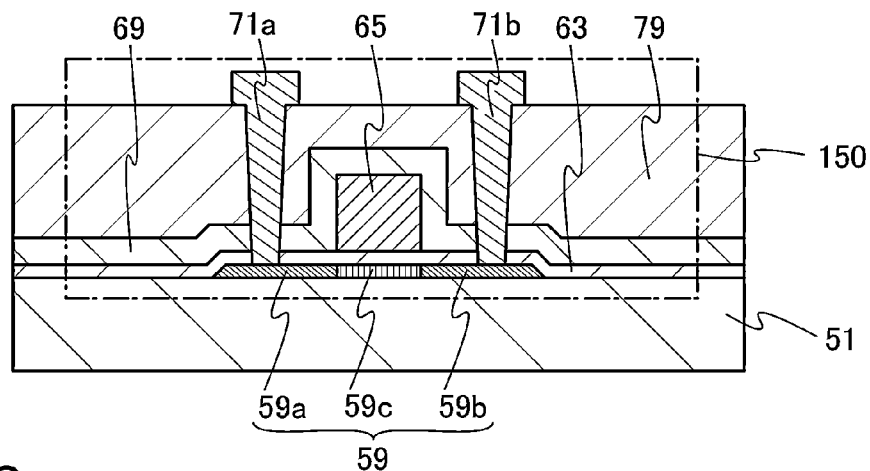
Figure 5C:
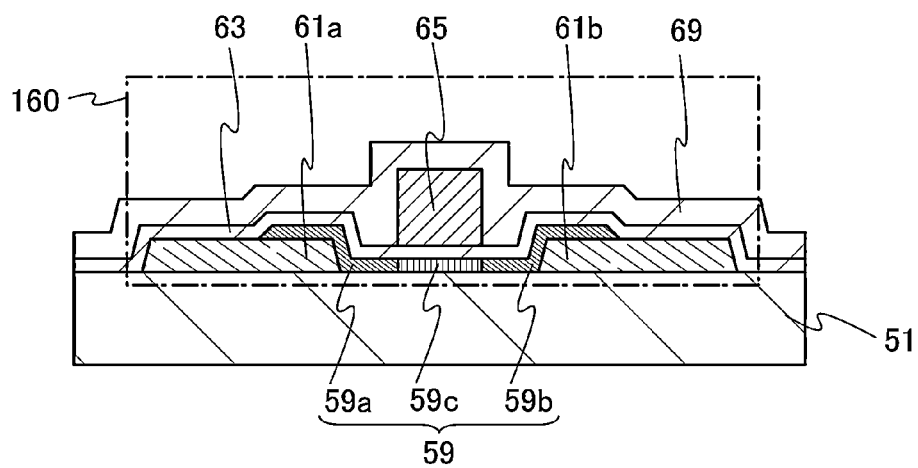

Further, as illustrated in FIGS. 5A to 5C, impurity regions functioning as a source region and a drain region may be formed in part of the crystalline oxide semiconductor film 59. The impurity regions functioning as a source region and a drain region are formed by adding an impurity (also referred to as a dopant) that changes conductivity to the crystalline oxide semiconductor film 59.

A transistor 140 illustrated in FIG. 5A has the same structure as the transistor 110 illustrated in FIG. 2E except that a dopant is added using the gate electrode 65 as a mask. A channel formation region 59c is formed in a region which is in the crystalline oxide semiconductor film 59 and overlaps with the gate electrode 65, and an impurity region 59a and an impurity region 59b which function as a source region and a drain region are formed adjacent to the channel formation region. The other structure is similar to that of the transistor 110, and thus the description thereof can be referred to.

A transistor 150 illustrated in FIG. 5B has the same structure as the transistor 120 illustrated in FIG. 3E except that a dopant is added using the gate electrode 65 as a mask. The channel formation region 59c is formed in a region which is in the crystalline oxide semiconductor film 59 and overlaps with the gate electrode 65, and the impurity region 59a and the impurity region 59b which function as a source region and a drain region are formed adjacent to the channel formation region. The other structure is similar to that of the transistor 120, and thus the description thereof can be referred to.

A transistor 160 illustrated in FIG. 5C has the same structure as the transistor 130 illustrated in FIG. 4E except that a dopant is added using the gate electrode 65 as a mask. The channel formation region 59c is formed in a region which is in the crystalline oxide semiconductor film 59 and overlaps with the gate electrode 65, and the impurity region 59a and the impurity region 59b which function as a source region and a drain region are formed adjacent to the channel formation region. The other structure is similar to that of the transistor 130, and thus the description thereof can be referred to.

In each of the transistor 140, the transistor 150, and the transistor 160, the concentration of the dopant contained in the pair of impurity regions 59a and 59b functioning as a source region and a drain region is preferably higher than or equal to $5 \times 10^{18}$ atoms/cm$^3$ and lower than or equal to $1 \times 10^{22}$ atoms/cm$^3$, further preferably higher than or equal to $5 \times 10^{18}$ atoms/cm$^3$ and lower than $5 \times 10^{20}$ atoms/cm$^3$.

As a method for adding the dopant to the crystalline oxide semiconductor film 59, an ion doping method or an ion implantation method can be used. Further, Group 15 elements and boron are given as examples of the dopant to be added; specifically, one or more elements selected from phosphorus, arsenic, antimony, and boron are used.

In the impurity region 59a and the impurity region 59b which function as a source region and a drain region, the crystal structure of the crystalline oxide semiconductor film 59 might be broken to be an amorphous structure.

As in the transistor 140, the transistor 150, and the transistor 160, by providing the impurity region 59a and the impurity region 59b which function as a source region and a drain region, electric fields applied to end portions of the channel formation region 59c can be relieved. Accordingly, a short channel effect can be suppressed in these transistors. Moreover, when the impurity region 59a and the impurity region 59b which function as a source region and a drain region are provided and the source electrode and the drain electrode are connected to the impurity regions of the crystalline oxide semiconductor film 59, contact resistance can be reduced; thus, electric characteristics of the transistors can be improved.

As in the case of the transistor 100 described in the above embodiment, in each of the transistors 110 to 160 described above, by improving the planarity of the surface of the oxide semiconductor film so that projections and depressions are reduced, it is possible to reduce the possibility that, in the case where a top-gate transistor is manufactured using the oxide semiconductor film, a portion where coverage with a gate insulating film formed over and in contact with the oxide semiconductor film is locally poor is formed. Accordingly, even when the thickness of the gate insulating film is reduced for miniaturization of the transistor, an increase in the leakage current and power consumption of the transistor can be prevented. In other words, a miniaturized transistor in which an increase in power consumption is suppressed can be manufactured.

Moreover, electric characteristics of the oxide semiconductor film including a crystal having a c-axis substantially perpendicular to the film surface are stable; therefore, a change in electric characteristics due to irradiation with visible light or ultraviolet light can be suppressed. Accordingly, a highly reliable semiconductor device having stable electric characteristics can be provided.

Further, since the planarity of the surface of the oxide semiconductor film is improved, crystals having c-axes substantially perpendicular to the film surface are formed in a layered manner along the surface. A continuous growth face of the crystals having the c-axes is formed in the oxide semiconductor film, so that the crystallinity of the oxide semiconductor film is improved. Accordingly, higher mobility can be obtained in a transistor formed using the oxide semiconductor film.

The structures, methods, and the like described in this embodiment can be combined as appropriate with any of the other structures, methods, and the like described in this embodiment or any of the structures, methods, and the like described in the other embodiments.

Embodiment 3

In this embodiment, as an example of a semiconductor device formed by the method for manufacturing a semiconductor device, which is described in the above embodiment, a storage medium (a memory element) will be described. In this embodiment, a transistor formed using an oxide semiconductor by the method for manufacturing a semiconductor device, which is described in the above embodiment, and a transistor formed using a material other than an oxide semiconductor are formed over one substrate.

Figure 6A:
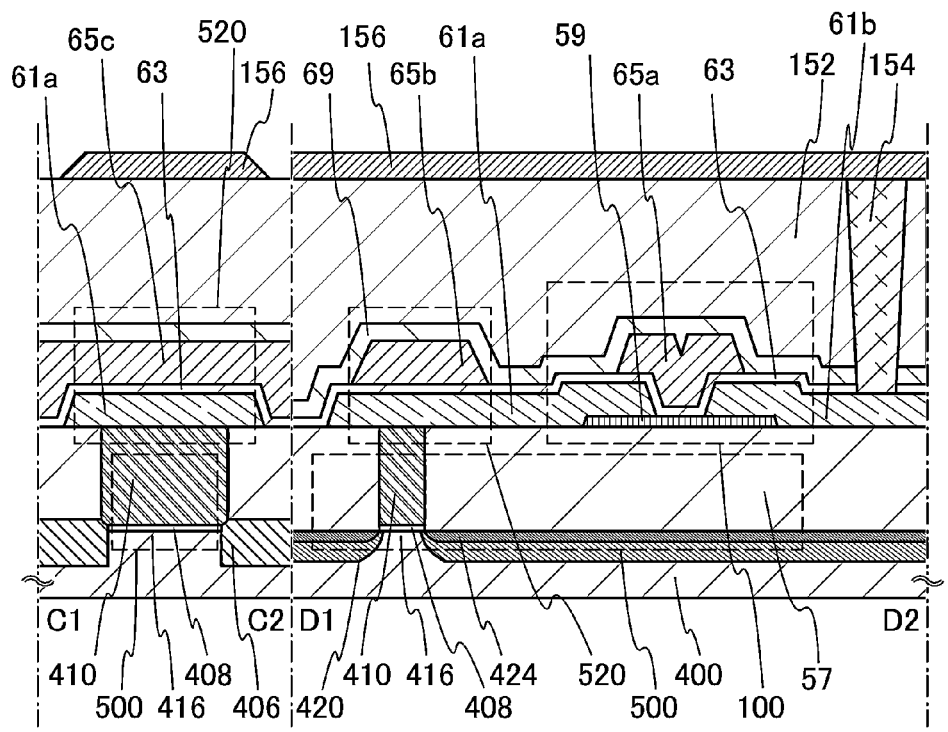
FIGS. 6A to 6C are a cross-sectional view, a plan view, and a circuit diagram, respectively, which illustrate a semiconductor device according to one embodiment of the present invention.
Figure 6B:
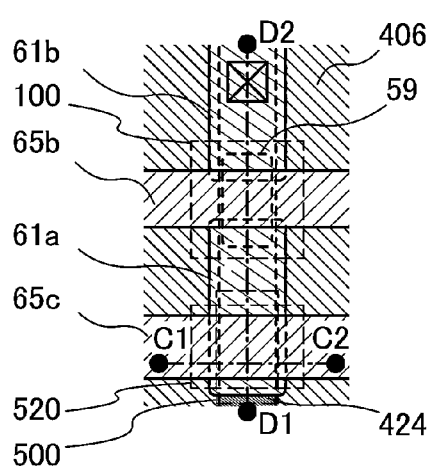
Figure 6C:
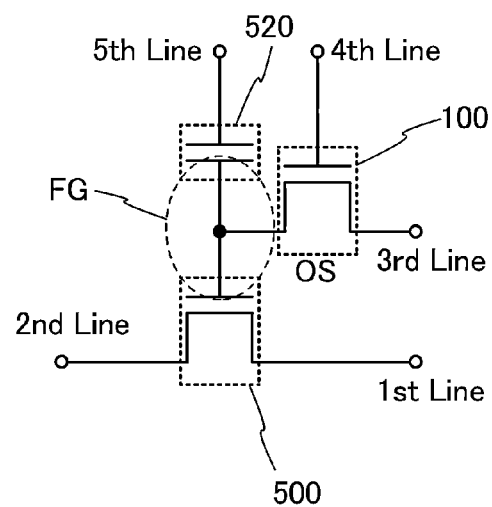

FIGS. 6A to 6C illustrate an example of a structure of a semiconductor device. FIG. 6A illustrates a cross section of the semiconductor device, and FIG. 6B illustrates a plan view of the semiconductor device. Here, FIG. 6A illustrates a cross section taken along line C1-C2 and line D1-D2 in FIG. 6B. In addition, FIG. 6C is an example of a diagram of a circuit using the semiconductor device as a memory element. In the semiconductor device illustrated in FIGS. 6A and 6B, a transistor 500 formed using a first semiconductor material is provided in a lower portion, and the transistor 100 described in the above embodiment is provided in an upper portion. Note that the transistor 100 is formed using an oxide semiconductor as a second semiconductor material. In this embodiment, the first semiconductor material is a semiconductor material other than an oxide semiconductor. As the semiconductor material other than an oxide semiconductor, for example, silicon, germanium, silicon germanium, silicon carbide, or gallium arsenide can be used, and a single crystal semiconductor is preferably used. Alternatively, an organic semiconductor material or the like may be used. A transistor formed using such a semiconductor material can operate at high speed easily. On the other hand, one of features of a transistor formed using an oxide semiconductor is extremely small off-state current, which enables electric charge to be held for a long time.

Note that in this embodiment, an example in which the storage medium is formed using the transistor 100 is described; needless to say, any of the transistors 110 to 160 described in the above embodiment, and the like can be used instead of the transistor 100.

The transistor 500 in FIGS. 6A to 6C includes a channel formation region 416 provided in a substrate 400 including a semiconductor material (e.g., silicon); impurity regions 420 provided so that the channel formation region 416 is interposed therebetween; metal compound regions 424 in contact with the impurity regions 420; a gate insulating layer 408 provided over the channel formation region 416; and a gate electrode 410 provided over the gate insulating layer 408.

As the substrate 400 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor film is provided over an insulating surface, the term "SOI substrate" in this specification and the like also includes a substrate in which a semiconductor film formed using a material other than silicon is provided over an insulating surface. That is, a semiconductor film included in the "SOI substrate" is not limited to a silicon semiconductor film. Moreover, the SOI substrate can be a substrate in which a semiconductor film is provided over an insulating substrate such as a glass substrate with an insulating layer positioned therebetween.

An element isolation insulating layer 406 is provided on the substrate 400 so as to surround the transistor 500. Note that it is preferable that the transistor 500 be not provided with a sidewall insulating layer as illustrated in FIGS. 6A and 6B to achieve higher integration. On the other hand, in the case where characteristics of the transistor 500 have priority, sidewall insulating layers may be provided on side surfaces of the gate electrode 410, and the impurity regions 420 including regions with different impurity concentrations may be provided.

The transistor 500 can be manufactured using silicon, germanium, silicon germanium, silicon carbide, gallium arsenide, or the like. The transistor 500 can operate at high speed. Thus, when the transistor is used as a reading transistor, data can be read at high speed.

An insulating film 57 is provided so as to cover the transistor 500, and the crystalline oxide semiconductor film 59 is provided over the insulating film 57. The insulating film 57 corresponds to the base insulating film described in the above embodiment, and thus the description in the above embodiment can be referred to for the method for forming the insulating film 57.

Note that when the insulating film 57 is polished by chemical mechanical polishing (CMP) or the like, a top surface of the gate electrode 410 can be exposed on the insulating film 57.

As in the above embodiment, the transistor 100 includes the crystalline oxide semiconductor film 59, the source electrode 61a, the drain electrode 61b, the gate insulating film 63, and a gate electrode 65a. As for details, the description in the above embodiment can be referred to. A transistor in the upper portion, which is typified by the transistor 100, can be manufactured by the method described in the above embodiment.

Here, the crystalline oxide semiconductor film used in the transistor 100 has a certain level or more of crystallinity, which is favorable as compared with that of an entirely amorphous oxide semiconductor film; therefore, defects typified by oxygen vacancies and impurities such as hydrogen bonded to dangling bonds or the like are reduced. Therefore, the crystalline oxide semiconductor film in which such impurities are reduced has stable electric conductivity and is more electrically stable with respect to irradiation with visible light, ultraviolet light, and the like. By using such a crystalline oxide semiconductor film for a transistor, a highly reliable semiconductor device having stable electric characteristics can be provided.

Moreover, since the planarity of a surface of the crystalline oxide semiconductor film 59 is improved, crystals having c-axes substantially perpendicular to the surface of the crystalline oxide semiconductor film 59 are formed in a layered manner along the surface. A continuous growth face of the crystals having the c-axes is formed in the crystalline oxide semiconductor film 59, so that the crystallinity of the crystalline oxide semiconductor film 59 is improved. Accordingly, higher mobility can be obtained in the transistor 100 formed using the crystalline oxide semiconductor film 59.

Here, the source electrode 61a is provided in contact with the gate electrode 410; thus, the gate electrode 410 of the transistor 500 and the source electrode 61a of the transistor 100 are connected to each other.

Further, a wiring 65b in the same layer as the gate electrode 65a is provided over the source electrode 61a with the gate insulating film 63 positioned therebetween, so that a capacitor 520 can be formed. In the case where a capacitor is not needed, it is possible to employ a structure without the capacitor 520.

Further, the insulating film 69 and an insulating layer 152 are formed over the gate insulating film 63, the gate electrode 65a, and the wiring 65b. The description in the above embodiment can be referred to for details of the insulating film 69. The insulating layer 152 can be formed by a sputtering method, a CVD method, or the like. The insulating layer 152 can be formed using a material containing an inorganic insulating material such as silicon oxide, silicon oxynitride, silicon nitride, hafnium oxide, aluminum oxide, or gallium oxide.

A wiring 156 is formed over the insulating layer 152. The wiring 156 is electrically connected to the drain electrode 61b through an electrode 154 formed in an opening provided in the gate insulating film 63, the insulating film 69, and the insulating layer 152.

The electrode 154 can be formed in such a manner, for example, that a conductive film is formed in a region including the opening by a PVD method, a CVD method, or the like and then part of the conductive film is removed by etching, CMP, or the like.

The wiring 156 can be formed in such a manner that a conductive layer is formed by a PVD method such as a sputtering method or a CVD method such as a plasma CVD method and then the conductive layer is patterned. The wiring 156 can be formed using a material similar to that for the source electrode 61a and the drain electrode 61b.

In the semiconductor device described in this embodiment, the transistor 500 and the transistor 100 overlap with each other; therefore, the integration degree of the semiconductor device can be sufficiently high.

FIG. 6C is an example of a diagram of a circuit using the semiconductor device as a memory element. In FIG. 6C, one of a source electrode and a drain electrode of the transistor 100, one electrode of the capacitor 520, and a gate electrode of the transistor 500 are electrically connected to one another. A first wiring (1st Line, also referred to as a source line) is electrically connected to a source electrode of the transistor 500. A second wiring (2nd Line, also referred to as bit line) is electrically connected to a drain electrode of the transistor 500. In addition, a third wiring (3rd Line, also referred to as a first signal line) is electrically connected to the other of the source electrode and the drain electrode of the transistor 100, and a fourth wiring (4th Line, also referred to as a second signal line) is electrically connected to a gate electrode of the transistor 100. A fifth wiring (5th Line, also referred to as a word line) is electrically connected to the other electrode of the capacitor 520.

The transistor 100 formed using an oxide semiconductor has extremely small off-state current; therefore, when the transistor 100 is in an off state, the potential of a node (hereinafter a node FG) where one of the source electrode and the drain electrode of the transistor 100, one electrode of the capacitor 520, and the gate electrode of the transistor 500 are electrically connected to one another can be held for an extremely long time. Provision of the capacitor 520 facilitates holding of electric charge applied to the node FG and reading of stored data.

When data is stored in the semiconductor device (writing), first, the potential of the fourth wiring is set to a potential at which the transistor 100 is turned on, whereby the transistor 100 is turned on. Thus, the potential of the third wiring is supplied to the node FG and a predetermined amount of electric charge is accumulated in the node FG. Here, electric charge for applying either of two different potential levels (hereinafter referred to as low-level electric charge and high-level electric charge) is given to the node FG. After that, the potential of the fourth wiring is set to a potential at which the transistor 100 is turned off, whereby the transistor 100 is turned off. This makes the node FG floating and the predetermined amount of electric charge is held in the node FG. The predetermined amount of electric charge is thus accumulated and held in the node FG, whereby the memory cell can store data.

Since the off-state current of the transistor 100 is extremely small, the electric charge applied to the node FG is held for a long time. This can remove the need of refresh operation or drastically reduce the frequency of the refresh operation, which leads to a sufficient reduction in power consumption. Moreover, stored data can be held for a long time even when power is not supplied.

When stored data is read (reading), while a predetermined potential (a fixed potential) is supplied to the first wiring, an appropriate potential (a reading potential) is supplied to the fifth wiring, whereby the transistor 500 changes its state depending on the amount of electric charge held in the node FG. This is because, in general, when the transistor 500 is an n-channel transistor, an apparent threshold voltage $V_{th\_H}$ of the transistor 500 in the case where the high-level electric charge is held in the node FG is lower than an apparent threshold voltage $V_{th\_L}$ of the transistor 500 in the case where the low-level electric charge is held in the node FG. Here, the apparent threshold voltage refers to the potential of the fifth wiring, which is needed to turn on the transistor 500. Thus, by setting the potential of the fifth wiring to a potential $V_0$ which is between $V_{th\_H}$ and $V_{th\_L}$, electric charge held in the node FG can be determined. For example, in the case where the high-level electric charge is applied in writing, the transistor 500 is turned on when the potential of the fifth wiring is set to $V_0$ ($>V_{th\_H}$). In the case where the low-level electric charge is applied in writing, even when the potential of the fifth wiring is set to $V_0$ ($<V_{th\_L}$), the transistor 500 remains in an off state. In such a manner, by controlling the potential of the fifth wiring and determining whether the transistor 500 is an on state or an off state (reading the potential of the second wiring), stored data can be read.

Further, in order to rewrite stored data, a new potential is supplied to the node FG that is holding the predetermined amount of electric charge applied in the above writing, so that electric charge of new data is held in the node FG. Specifically, the potential of the fourth wiring is set to a potential at which the transistor 100 is turned on, whereby the transistor 100 is turned on. Thus, the potential of the third wiring (a potential of new data) is supplied to the node FG, and a predetermined amount of electric charge is accumulated in the node FG. After that, the potential of the fourth wiring is set to a potential at which the transistor 100 is turned off, whereby the transistor 100 is turned off. Thus, the electric charge of the new data is held in the node FG. In other words, while the predetermined amount of electric charge applied in the first writing is held in the node FG, the same operation (second writing) as in the first writing is performed, whereby the stored data can be overwritten.

In the transistor 100 described in this embodiment, by improving the planarity of the surface of the oxide semiconductor film so that projections and depressions are reduced, it is possible to reduce the possibility that a portion where coverage with a gate insulating film formed over and in contact with the oxide semiconductor film is locally poor is formed. Accordingly, even when the thickness of the gate insulating film is reduced for miniaturization of the transistor, an increase in the leakage current and power consumption of the transistor can be prevented. In other words, a miniaturized transistor in which an increase in power consumption is suppressed can be manufactured. Further, with the use of such a transistor, a semiconductor device having low power consumption and high storage capacity per unit area can be obtained.

Further, the off-state current of the transistor 100 can be sufficiently reduced by using the highly purified intrinsic crystalline oxide semiconductor film 59. Moreover, electric characteristics of the oxide semiconductor film including a crystal having a c-axis substantially perpendicular to the film surface are stable; therefore, a change in electric characteristics due to irradiation with visible light or ultraviolet light can be suppressed. By using the crystalline oxide semiconductor film 59 for the transistor 100, a highly reliable transistor having stable electric characteristics can be provided. Further, with the use of such a transistor, a highly reliable semiconductor device capable of holding stored data for an extremely long time can be obtained.

In addition, since the planarity of the surface of the oxide semiconductor film is improved, crystals having c-axes substantially perpendicular to the film surface are formed in a layered manner along the surface. A continuous growth face of the crystals having the c-axes is formed in the oxide semiconductor film, so that the crystallinity of the oxide semiconductor film is improved. Accordingly, higher mobility can be obtained in a transistor formed using the oxide semiconductor film. With the use of such a transistor, high-speed operation of the semiconductor device can be achieved.

The structures, methods, and the like described in this embodiment can be combined as appropriate with any of the structures, methods, and the like described in the other embodiments.

Embodiment 4

In this embodiment, application examples of a semiconductor device according to one embodiment of the invention disclosed herein will be described with reference to FIGS. 7A and 7B.

Figure 7A:
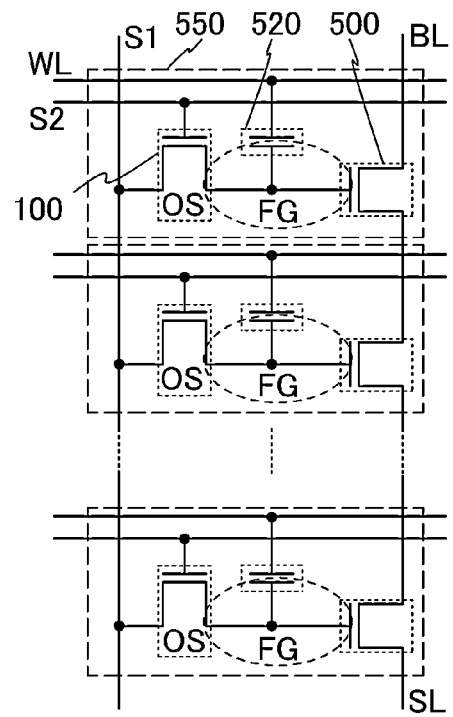
FIGS. 7A and 7B are each a circuit diagram illustrating a semiconductor device according to one embodiment of the present invention.
Figure 7B:
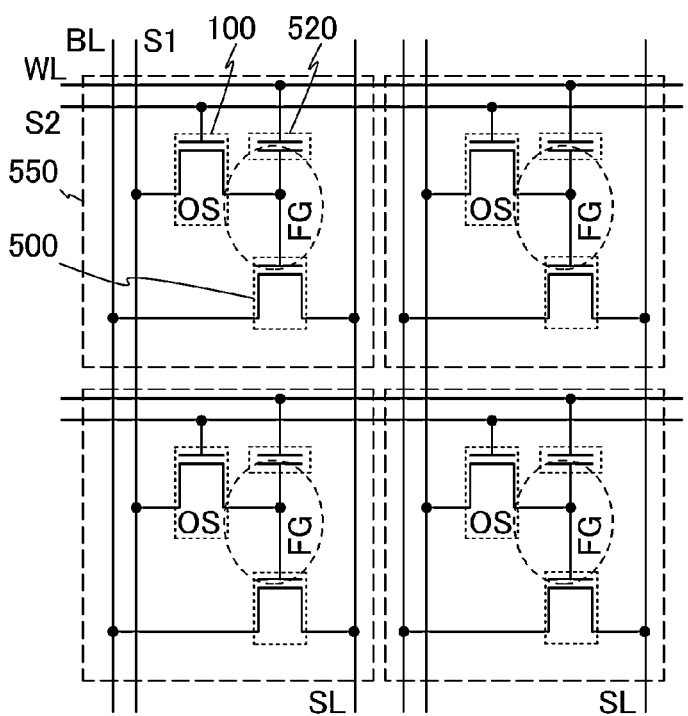

FIGS. 7A and 7B are circuit diagrams of semiconductor devices each including a plurality of semiconductor devices (hereinafter also referred to as memory cells 550) illustrated in FIGS. 6A to 6C. FIG. 7A is a circuit diagram of a so-called NAND semiconductor device in which the memory cells 550 are connected in series, and FIG. 7B is a circuit diagram of a so-called NOR semiconductor device in which the memory cells 550 are connected in parallel.

The semiconductor device illustrated in FIG. 7A includes a source line SL, a bit line BL, a first signal line S1, a plurality of second signal lines S2, a plurality of word lines WL, and the plurality of memory cells 550. In FIG. 7A, one source line SL and one bit line BL are provided in the semiconductor device; however, one embodiment of the present invention is not limited to this structure. A plurality of source lines SL and a plurality of bit lines BL may be provided.

In each of the memory cells 550, a gate electrode of the transistor 500, one of a source electrode and a drain electrode of the transistor 100, and one electrode of the capacitor 520 are electrically connected to one another. In addition, the first signal line S1 and the other of the source electrode and the drain electrode of the transistor 100 are electrically connected to each other, and the second signal line S2 and a gate electrode of the transistor 100 are electrically connected to each other. The word line WL and the other electrode of the capacitor 520 are electrically connected to each other.

Further, a source electrode of the transistor 500 included in the memory cell 550 is electrically connected to a drain electrode of the transistor 500 in the adjacent memory cell 550. The drain electrode of the transistor 500 included in the memory cell 550 is electrically connected to the source electrode of the transistor 500 in the adjacent memory cell 550. Note that the drain electrode of the transistor 500 included in the memory cell 550 of the plurality of memory cells connected in series, which is provided at one end, is electrically connected to the bit line. In addition, the source electrode of the transistor 500 included in the memory cell 550 of the plurality of memory cells connected in series, which is provided at the other end, is electrically connected to the source line.

In the semiconductor device illustrated in FIG. 7A, writing operation and reading operation are performed for each row. The writing operation is performed as follows. A potential at which the transistor 100 is turned on is supplied to the second signal line S2 of a row where writing is to be performed, whereby the transistor 100 of the row where writing is to be performed is turned on. Accordingly, the potential of the first signal line S1 is supplied to the gate electrode of the transistor 500 of the specified row, so that predetermined electric charge is applied to the gate electrode. Thus, data can be written into the memory cell of the specified row.

Further, the reading operation is performed as follows. First, a potential at which the transistor 500 is turned on regardless of electric charge applied to the gate electrode of the transistor 500 is supplied to the word lines WL of rows other than a row where reading is to be performed, so that the transistors 500 of the rows other than the row where reading is to be performed are turned on. Then, a potential (a reading potential) at which an on state or an off state of the transistor 500 is determined depending on electric charge in the gate electrode of the transistor 500 is supplied to the word line WL of the row where reading is to be performed. After that, a constant potential is supplied to the source line SL, and a reading circuit (not illustrated) connected to the bit line BL is operated. Here, the plurality of transistors 500 between the source line SL and the bit line BL are in an on state except the transistor 500 of the row where reading is to be performed; therefore, conductance between the source line SL and the bit line BL is determined by the state (an on state or an off state) of the transistor 500 of the row where reading is to be performed. The conductance of the transistor 500 of the row where reading is to be performed depends on electric charge in the gate electrode thereof. Thus, the potential of the bit line BL varies accordingly. By reading the potential of the bit line with the reading circuit, data can be read from the memory cell of the specified row.

The semiconductor device illustrated in FIG. 7B includes a plurality of source lines SL, a plurality of bit lines BL, a plurality of first signal lines S1, a plurality of second signal lines S2, a plurality of word lines WL, and the plurality of memory cells 550. A gate electrode of the transistor 500, one of a source electrode and a drain electrode of the transistor 100, and one electrode of the capacitor 520 are electrically connected to one another. The source line SL and a source electrode of the transistor 500 are electrically connected to each other. The bit line BL and a drain electrode of the transistor 500 are electrically connected to each other. In addition, the first signal line S1 and the other of the source electrode and the drain electrode of the transistor 100 are electrically connected to each other, and the second signal line S2 and a gate electrode of the transistor 100 are electrically connected to each other. The word line WL and the other electrode of the capacitor 520 are electrically connected to each other.

In the semiconductor device illustrated in FIG. 7B, writing operation and reading operation are performed for each row. The writing operation is performed in a manner similar to that in the semiconductor device illustrated in FIG. 7A. The reading operation is performed as follows. First, a potential at which the transistor 500 is turned off regardless of electric charge applied to the gate electrode of the transistor 500 is supplied to the word lines WL of rows other than a row where reading is to be performed, so that the transistors 500 of the rows other than the row where reading is to be performed are turned off. Then, a potential (a reading potential) at which an on state or an off state of the transistor 500 is determined depending on electric charge in the gate electrode of the transistor 500 is supplied to the word line WL of the row where reading is to be performed. After that, a constant potential is supplied to the source lines SL, and a reading circuit (not illustrated) connected to the bit lines BL is operated. Here, conductance between the source lines SL and the bit lines BL is determined by the state (an on state or an off state) of the transistors 500 of the row where reading is to be performed. That is, the potential of the bit lines BL depends on electric charge in the gate electrodes of the transistors 500 of the row where reading is to be performed. By reading the potential of the bit lines with the reading circuit, data can be read from the memory cells of the specified row.

Although the amount of data which can be stored in each of the memory cells 550 is one bit in the above description, the structure of the semiconductor device in this embodiment is not limited thereto. The amount of data which can be stored in each of the memory cells 550 may be increased by preparing three or more potentials to be supplied to the gate electrode of the transistor 500. For example, in the case where the number of potentials to be supplied to the gate electrode of the transistor 500 is four, data of two bits can be stored in each of the memory cells.

The structures, methods, and the like described in this embodiment can be combined as appropriate with any of the structures, methods, and the like described in the other embodiments.

Embodiment 5

In this embodiment, examples of a semiconductor device using the transistor described in any of the above embodiments will be described with reference to FIGS. 8A and 8B.

Figure 8A:
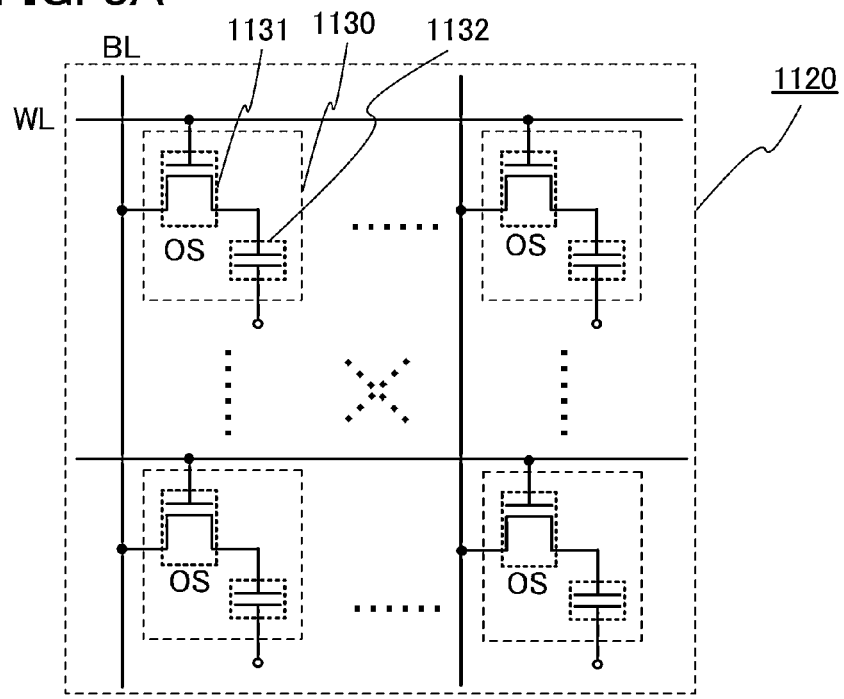
FIGS. 8A and 8B are each a circuit diagram illustrating a semiconductor device according to one embodiment of the present invention.

FIG. 8A illustrates an example of a semiconductor device having a structure corresponding to that of a so-called dynamic random access memory (DRAM). A memory cell array 1120 illustrated in FIG. 8A has a structure in which a plurality of memory cells 1130 is arranged in a matrix. Further, the memory cell array 1120 includes m first wirings and n second wirings. Note that in this embodiment, the first wiring and the second wiring are referred to as a word line WL and a bit line BL, respectively.

The memory cell 1130 includes a transistor 1131 and a capacitor 1132. A gate electrode of the transistor 1131 is connected to the first wiring (the word line WL). Further, one of a source electrode and a drain electrode of the transistor 1131 is connected to the second wiring (the bit line BL). The other of the source electrode and the drain electrode of the transistor 1131 is connected to one electrode of the capacitor. The other electrode of the capacitor is connected to a capacitor line CL and is supplied with a predetermined potential. Any of the transistors 100 to 160 described in the above embodiments is used as the transistor 1131.

The transistor described in any of the above embodiments is formed using the highly purified intrinsic crystalline oxide semiconductor film 59 and thus can have sufficiently small off-state current. Moreover, electric characteristics of the oxide semiconductor film including a crystal having a c-axis substantially perpendicular to a film surface are stable; therefore, a change in electric characteristics due to irradiation with visible light or ultraviolet light can be suppressed. By using the crystalline oxide semiconductor film 59 for the transistor 1131, a highly reliable transistor having stable electric characteristics can be provided. Further, with the use of such a transistor, the semiconductor device in FIG. 8A, which is regarded as a so-called DRAM, can be used as a substantially nonvolatile memory.

Figure 8B:
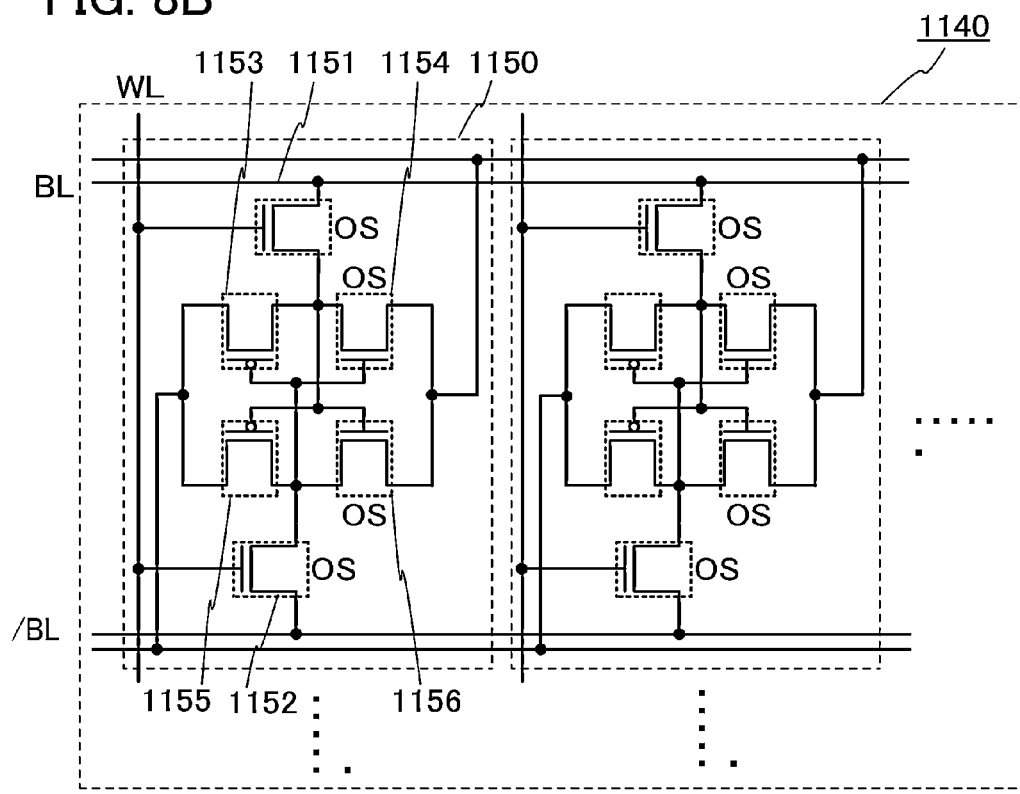

FIG. 8B illustrates an example of a semiconductor device having a structure corresponding to that of a so-called static random access memory (SRAM). A memory cell array 1140 illustrated in FIG. 8B can have a structure in which a plurality of memory cells 1150 is arranged in a matrix. Further, the memory cell array 1140 includes a plurality of first wirings (word lines WL), a plurality of second wirings (bit lines BL), and a plurality of third wirings (inverted bit lines /BL).

The memory cell 1150 includes a first transistor 1151, a second transistor 1152, a third transistor 1153, a fourth transistor 1154, a fifth transistor 1155, and a sixth transistor 1156. The first transistor 1151 and the second transistor 1152 function as selection transistors. One of the third transistor 1153 and the fourth transistor 1154 is an n-channel transistor (here, the fourth transistor 1154 is an n-channel transistor), and the other of the third transistor 1153 and the fourth transistor 1154 is a p-channel transistor (here, the third transistor 1153 is a p-channel transistor). In other words, the third transistor 1153 and the fourth transistor 1154 form a CMOS circuit. Similarly, the fifth transistor 1155 and the sixth transistor 1156 form a CMOS circuit.

The first transistor 1151, the second transistor 1152, the fourth transistor 1154, and the sixth transistor 1156 are n-channel transistors and the transistor described in any of the above embodiments can be applied to these transistors. Each of the third transistor 1153 and the fifth transistor 1155 is a p-channel transistor in which a channel formation region is formed using a material (e.g., single crystal silicon) other than an oxide semiconductor.

The structures, methods, and the like described in this embodiment can be combined as appropriate with any of the structures, methods, and the like described in the other embodiments.

Embodiment 6

A central processing unit (CPU) can be formed using a transistor in which a channel formation region is formed using an oxide semiconductor for at least part of the CPU.

Figure 9A:
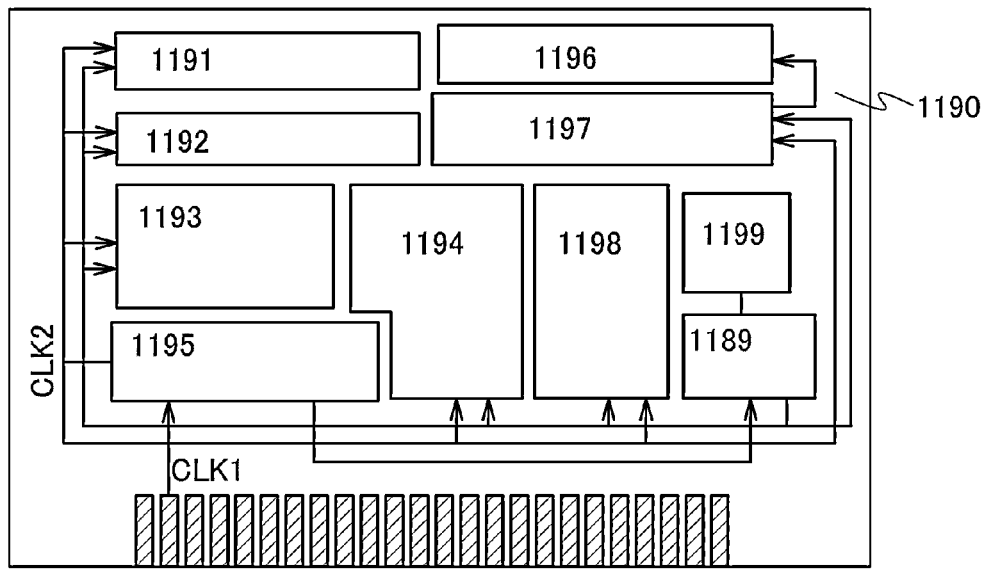
FIGS. 9A to 9C are block diagrams illustrating a semiconductor device according to one embodiment of the present invention.

FIG. 9A is a block diagram illustrating a specific structure of a CPU. The CPU illustrated in FIG. 9A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and a ROM interface (ROM I/F) 1189 over a substrate 1190. A semiconductor substrate, an SOI substrate, a glass substrate, or the like is used as the substrate 1190. The ROM 1199 and the ROM I/F 1189 may be provided over a separate chip. Needless to say, the CPU illustrated in FIG. 9A is just an example in which the structure is simplified, and an actual CPU may have various structures depending on the application.

An instruction that is input to the CPU through the Bus I/F 1198 is input to the instruction decoder 1193 and decoded therein, and then input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/into the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the clock signal CLK2 to the above circuits.

In the CPU illustrated in FIG. 9A, a memory element is provided in the register 1196. The memory element described in any of Embodiments 3 to 5 can be used as the memory element provided in the register 1196.

In the CPU illustrated in FIG. 9A, the register controller 1197 selects operation of holding data in the register 1196 in accordance with an instruction from the ALU 1191. That is, the register controller 1197 selects whether data is held by a flip-flop or a capacitor in the memory element included in the register 1196. When data holding by the flip-flop is selected, power supply voltage is supplied to the memory element in the register 1196. When data holding by the capacitor is selected, the data is rewritten in the capacitor, and supply of power supply voltage to the memory element in the register 1196 can be stopped.

Figure 9B:
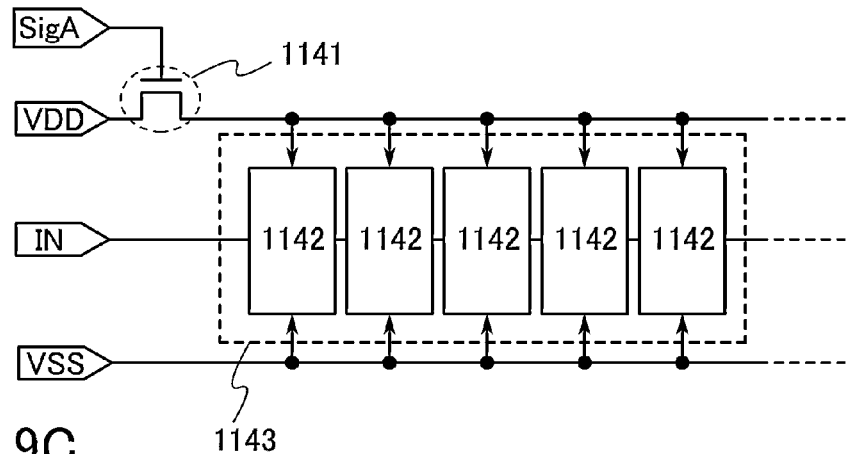
Figure 9C:
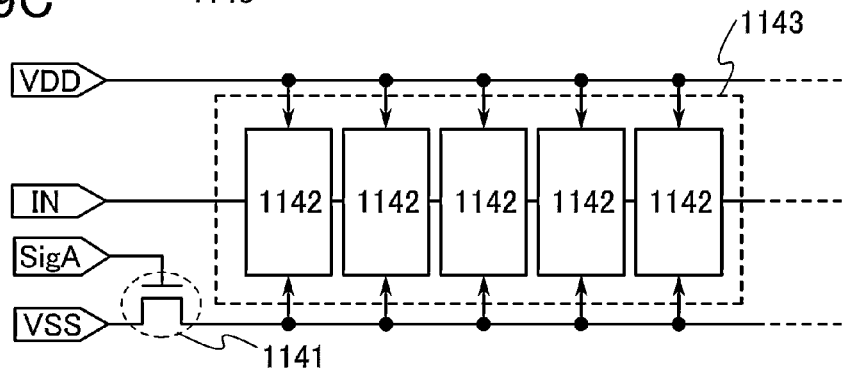

The power supply can be stopped by providing a switching element between a memory element group and a node to which a power supply potential VDD or a power supply potential VSS is supplied, as illustrated in FIG. 9B or FIG. 9C. Circuits illustrated in FIGS. 9B and 9C will be described below.

FIGS. 9B and 9C each illustrate an example of a structure of a memory circuit including a transistor in which a channel formation region is formed using an oxide semiconductor as a switching element for controlling supply of a power supply potential to a memory element.

The memory device illustrated in FIG. 9B includes a switching element 1141 and a memory element group 1143 including a plurality of memory elements 1142. Specifically, as each of the memory elements 1142, the memory element described in any of Embodiments 3 to 5 can be used. Each of the memory elements 1142 included in the memory element group 1143 is supplied with the high-level power supply potential VDD via the switching element 1141. Further, each of the memory elements 1142 included in the memory element group 1143 is supplied with a potential of a signal IN and the low-level power supply potential VSS.

In FIG. 9B, a transistor in which a channel formation region is formed using an oxide semiconductor is used as the switching element 1141, and the switching of the transistor is controlled by a signal Sig A supplied to a gate electrode thereof.

Note that FIG. 9B illustrates a structure in which the switching element 1141 includes only one transistor; however, one embodiment of the present invention is not limited thereto, and the switching element 1141 may include a plurality of transistors. In the case where the switching element 1141 includes a plurality of transistors which serve as switching elements, the plurality of transistors may be connected to each other in parallel, in series, or in a series-parallel combination.

Although the switching element 1141 controls the supply of the high-level power supply potential VDD to each of the memory elements 1142 included in the memory element group 1143 in FIG. 9B, the switching element 1141 may control the supply of the low-level power supply potential VSS.

FIG. 9C illustrates an example of a memory device in which each of the memory elements 1142 included in the memory element group 1143 is supplied with the low-level power supply potential VSS via the switching element 1141. The supply of the low-level power supply potential VSS to each of the memory elements 1142 included in the memory element group 1143 can be controlled by the switching element 1141.

When a switching element is provided between a memory element group and a node to which the power supply potential VDD or the power supply potential VSS is supplied, data can be held even in the case where operation of a CPU is temporarily stopped and the supply of the power supply voltage is stopped; accordingly, power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

The structures, methods, and the like described in this embodiment can be combined as appropriate with any of the structures, methods, and the like described in the other embodiments.

Embodiment 7

In this embodiment, an example in which at least part of a driver circuit and a transistor disposed in a pixel portion are formed over one substrate will be described below.

The transistor disposed in the pixel portion is formed in accordance with the method described in the above embodiment. Further, the transistor can be easily formed as an n-channel transistor, and thus part of a driver circuit that can be formed using an n-channel TFT can be formed over the same substrate as the transistor of the pixel portion. By using the transistor described in any of the above embodiments for the pixel portion or the driver circuit in this manner, a highly reliable display device can be provided.

Figure 10A:
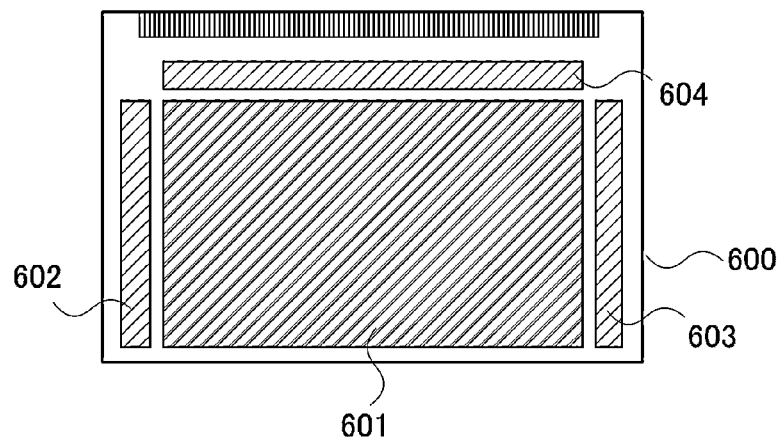
FIGS. 10A to 10C are a block diagram and circuit diagrams which illustrate a semiconductor device according to one embodiment of the present invention.

FIG. 10A is an example of a block diagram of an active matrix display device. A pixel portion 601, a first scan line driver circuit 602, a second scan line driver circuit 603, and a signal line driver circuit 604 are provided over a substrate 600 in the display device. In the pixel portion 601, a plurality of signal lines extended from the signal line driver circuit 604 is arranged and a plurality of scan lines extended from the first scan line driver circuit 602 and the second scan line driver circuit 603 is arranged. Note that pixels which include display elements are provided in a matrix in respective regions where the scan lines and the signal lines intersect with each other. The substrate 600 of the display device is connected to a timing control circuit (also referred to as a controller or a control IC) through a connection portion such as a flexible printed circuit (FPC).

In FIG. 10A, the first scan line driver circuit 602, the second scan line driver circuit 603, and the signal line driver circuit 604 are formed over the same substrate 600 as the pixel portion 601. Accordingly, the number of components of a drive circuit which is provided outside and the like are reduced, so that a reduction in cost can be achieved. Further, if the driver circuit is provided outside the substrate 600, wirings would need to be extended and the number of connections of wirings would be increased, but by providing the driver circuit over the substrate 600, the number of connections of the wirings can be reduced. Accordingly, reliability or yield can be improved.

Figure 10B:
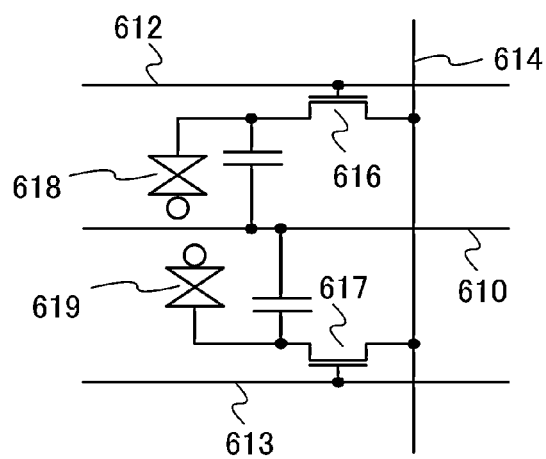

FIG. 10B illustrates an example of a circuit structure of the pixel portion. Here, a pixel structure of a VA liquid crystal display panel is illustrated.

In this pixel structure, a plurality of pixel electrode layers is provided in one pixel, and transistors are connected to the respective pixel electrode layers. The TFTs are driven by different gate signals. In other words, signals applied to individual pixel electrode layers in a multi-domain pixel are controlled independently.

A gate wiring 612 of a transistor 616 and a gate wiring 613 of a transistor 617 are separated from each other so that different gate signals can be supplied thereto. In contrast, a source or drain electrode layer 614 functioning as a data line is used in common for the transistor 616 and the transistor

617. As the transistor 616 and the transistor 617, the transistor described in any of the above embodiments can be used as appropriate. In this manner, a highly reliable liquid crystal display panel can be provided.

A first pixel electrode layer electrically connected to the transistor 616 and a second pixel electrode layer electrically connected to the transistor 617 have different shapes and are separated by a slit. The second pixel electrode layer is provided so as to surround the external side of the first pixel electrode layer which is spread in a V shape. Timing of voltage application is made to vary between the first pixel electrode layer and the second pixel electrode layer by the transistor 616 and the transistor 617 in order to control the alignment of liquid crystal. The transistor 616 is connected to the gate wiring 612, and the transistor 617 is connected to the gate wiring 613. When different gate signals are supplied to the gate wiring 612 and the gate wiring 613, operation timings of the transistor 616 and the transistor 617 can be varied.

Further, a storage capacitor is formed using a capacitor wiring 610, a gate insulating film functioning as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 618. Further, the second pixel electrode layer, the liquid crystal layer, and the counter electrode layer overlap with each other to form a second liquid crystal element 619. The pixel structure is a multi-domain structure in which the first liquid crystal element 618 and the second liquid crystal element 619 are provided in one pixel.

Note that the pixel structure is not limited to that illustrated in FIG. 10B. For example, a switch, a resistor, a capacitor, a transistor, a sensor, or a logic circuit may be added to the pixel illustrated in FIG. 10B.

Figure 10C:
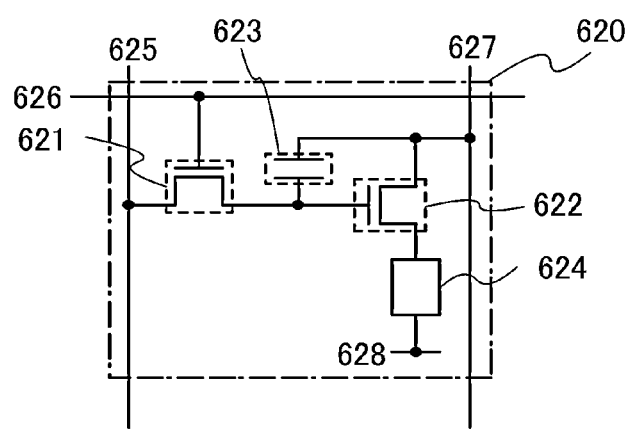

FIG. 10C illustrates an example of a circuit structure of the pixel portion. Here, a pixel structure of a display panel using an organic EL element is illustrated.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, this light-emitting element is referred to as a current-excitation light-emitting element.

FIG. 10C illustrates an example of a pixel structure to which digital time grayscale driving can be applied, as an example of a semiconductor device.

A structure and operation of a pixel to which digital time grayscale driving can be applied will be described. Here, one pixel includes two n-channel transistors each of which includes an oxide semiconductor layer as a channel formation region.

A pixel 620 includes a switching transistor 621, a driver transistor 622, a light-emitting element 624, and a capacitor 623. A gate electrode layer of the switching transistor 621 is connected to a scan line 626, a first electrode (one of a source electrode layer and a drain electrode layer) of the switching transistor 621 is connected to a signal line 625, and a second electrode (the other of the source electrode layer and the drain electrode layer) of the switching transistor 621 is connected to a gate electrode layer of the driver transistor 622. The gate electrode layer of the driver transistor 622 is connected to a power supply line 627 through the capacitor 623, a first electrode of the driver transistor 622 is connected to the power supply line 627, and a second electrode of the driver transistor 622 is connected to a first electrode (a pixel electrode) of the light-emitting element 624. A second electrode of the light-emitting element 624 corresponds to a common electrode 628. The common electrode 628 is electrically connected to a common potential line formed over the same substrate as the common electrode 628.

As the switching transistor 621 and the driver transistor 622, the transistor described in any of the above embodiments can be used as appropriate. In this manner, a highly reliable display panel using an organic EL element can be provided.

The second electrode (the common electrode 628) of the light-emitting element 624 is set to have a low power supply potential. Note that the low power supply potential is a potential satisfying the relation, the low power supply potential<a high power supply potential with the high power supply potential set for the power supply line 627 as a reference. For example, GND or 0 V may be set as the low power supply potential. A potential difference between the high power supply potential and the low power supply potential is applied to the light-emitting element 624 and current is supplied to the light-emitting element 624, so that the light-emitting element 624 emits light. Here, in order to make the light-emitting element 624 emit light, each potential is set so that the potential difference between the high power supply potential and the low power supply potential is greater than or equal to forward threshold voltage of the light-emitting element 624.

Note that gate capacitance of the driver transistor 622 may be used as a substitute for the capacitor 623, so that the capacitor 623 can be omitted. The gate capacitance of the driver transistor 622 may be formed between a channel formation region and the gate electrode layer.

In the case of a voltage-input voltage driving method, a video signal is input to the gate electrode layer of the driver transistor 622 so that the driver transistor 622 is in either of two states of being sufficiently turned on and turned off. That is, the driver transistor 622 operates in a linear region. In order for the driver transistor 622 to operate in a linear region, voltage higher than the voltage of the power supply line 627 is applied to the gate electrode layer of the driver transistor 622. Note that voltage higher than or equal to the sum of the voltage of the power supply line and Vth of the driver transistor 622 is applied to the signal line 625.

In the case of performing analog grayscale driving instead of digital time grayscale driving, the same pixel structure as in FIG. 10C can be employed by inputting signals in a different way.

In the case of performing analog grayscale driving, voltage higher than or equal to the sum of the forward voltage of the light-emitting element 624 and Vth of the driver transistor 622 is applied to the gate electrode layer of the driver transistor 622. The forward voltage of the light-emitting element 624 indicates voltage at which a desired luminance is obtained, and includes at least forward threshold voltage. By inputting a video signal which enables the driver transistor 622 to operate in a saturation region, current can be supplied to the light-emitting element 624. In order for the driver transistor 622 to operate in the saturation region, the potential of the power supply line 627 is set to be higher than a gate potential of the driver transistor 622. When an analog video signal is used, it is possible to supply current to the light-emitting element 624 in accordance with the video signal and perform analog grayscale driving.

Note that the pixel structure is not limited to that illustrated in FIG. 10C. For example, a switch, a resistor, a capacitor, a sensor, a transistor, or a logic circuit may be added to the pixel illustrated in FIG. 10C.

The structures, methods, and the like described in this embodiment can be combined as appropriate with any of the structures, methods, and the like described in the other embodiments.

Embodiment 8

A semiconductor device disclosed in this specification can be applied to a variety of electronic appliances (including game machines). Examples of electronic appliances are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, and a large-sized game machine such as a pachinko machine. Examples of electronic appliances each including the semiconductor device described in any of the above embodiments will be described.

Figure 11A:
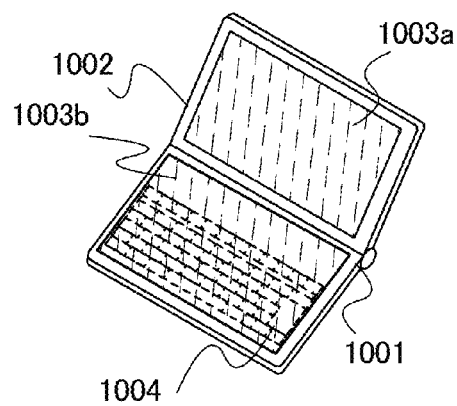
FIGS. 11A to 11D are each an external view illustrating an electronic appliance according to one embodiment of the present invention.

FIG. 11A illustrates a portable information terminal including a main body 1001, a housing 1002, display portions 1003a and 1003b, and the like. The display portion 1003b is a touch panel. By touching a keyboard button 1004 displayed on the display portion 1003b, a screen can be operated and text can be input. Needless to say, the display portion 1003a may be a touch panel. A liquid crystal panel or an organic light-emitting panel is manufactured using the transistor described in any of the above embodiments as a switching element and applied to the display portion 1003a or 1003b, whereby the reliability of the display portion of the portable information terminal can be improved.

The portable information terminal illustrated in FIG. 11A can have a function of displaying various kinds of information (e.g., a still image, a moving image, and a text image), a function of displaying a calendar, a date, the time, or the like on the display portion, a function of operating or editing the information displayed on the display portion, a function of controlling processing by various kinds of software (programs), and the like. Furthermore, an external connection terminal (such as an earphone terminal or a USB terminal), a recording medium insertion portion, and the like may be provided on the back surface or the side surface of the housing.

The portable information terminal illustrated in FIG. 11A may transmit and receive data wirelessly. Through wireless communication, desired book data or the like can be purchased and downloaded from an electronic book server.

Figure 11B:
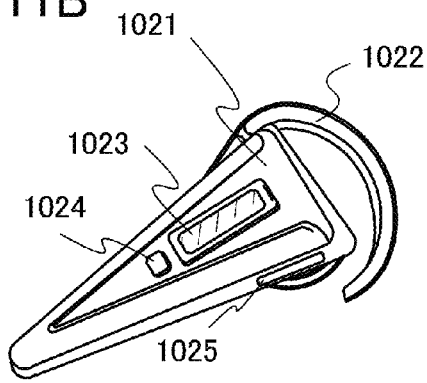

FIG. 11B illustrates a portable music player including, in a main body 1021, a display portion 1023, a fixing portion 1022 with which the portable music player can be worn on the ear, a speaker, an operation button 1024, an external memory slot 1025, and the like. A liquid crystal panel or an organic light-emitting panel is manufactured using the transistor described in any of the above embodiments as a switching element and applied to the display portion 1023, whereby the reliability of the display portion of the portable music player can be improved.

Furthermore, when the portable music player illustrated in FIG. 11B has an antenna, a microphone function, and a wireless communication function and is used with a mobile phone, a user can talk on the phone wirelessly in a hands-free way while driving a car or the like.

Figure 11C:
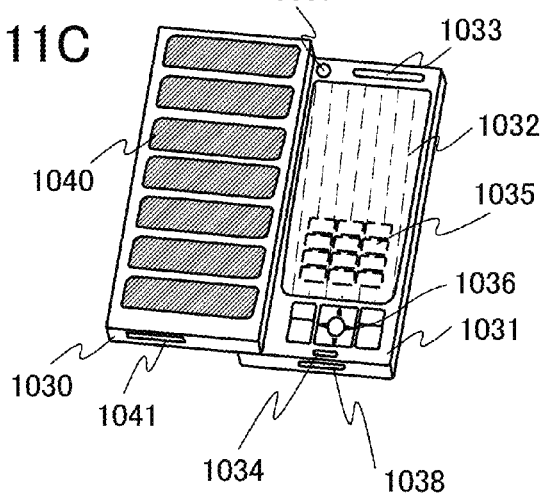

FIG. 11C illustrates a mobile phone including two housings, a housing 1030 and a housing 1031. The housing 1031 includes a display panel 1032, a speaker 1033, a microphone 1034, a pointing device 1036, a camera lens 1037, an external connection terminal 1038, and the like. Further, the housing 1030 includes a solar cell 1040 for charging of the mobile phone, an external memory slot 1041, and the like. In addition, an antenna is incorporated in the housing 1031. The transistor described in the any of the above embodiments is applied to the display panel 1032, whereby the reliability of the display portion of the mobile phone can be improved.

Further, the display panel 1032 includes a touch panel. A plurality of operation keys 1035 displayed as images is indicated by dotted lines in FIG. 11C. Note that a boosting circuit by which voltage output from the solar cell 1040 is increased to be sufficiently high for each circuit is also included.

In the display panel 1032, the direction of display is changed as appropriate depending on the usage pattern. Further, the mobile phone is provided with the camera lens 1037 on the same surface as the display panel 1032, and thus it can be used as a video phone. The speaker 1033 and the microphone 1034 can be used for videophone calls, recording and playing sound, and the like as well as voice calls. Moreover, the housings 1030 and 1031 in a state where they are developed as illustrated in FIG. 11C can shift by sliding so that one is lapped over the other. Therefore, the size of the mobile phone can be reduced, which makes the mobile phone suitable for being carried.

The external connection terminal 1038 can be connected to an AC adaptor and a variety of cables such as a USB cable, and charging and data communication with a personal computer or the like are possible. Further, by inserting a recording medium into the external memory slot 1041, a larger amount of data can be stored and moved.

Further, in addition to the above functions, an infrared communication function, a television reception function, or the like may be provided.

Figure 11D:
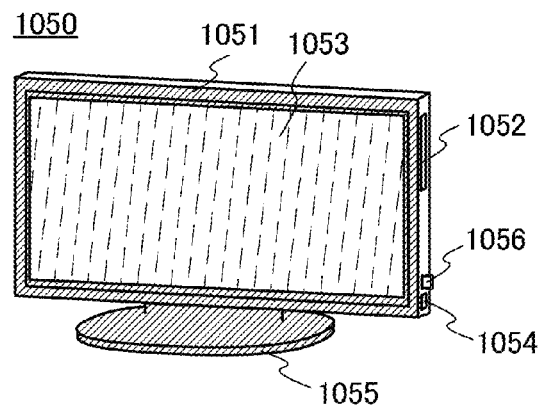

FIG. 11D illustrates an example of a television set. In a television set 1050, a display portion 1053 is incorporated in a housing 1051. Images can be displayed on the display portion 1053. Here, the housing 1051 is supported on a stand 1055 provided with a CPU. The transistor described in any of the above embodiments is applied to the display portion 1053, whereby the reliability of the display portion of the television set 1050 can be improved.

The television set 1050 can be operated with an operation switch of the housing 1051 or a separate remote controller. Further, the remote controller may be provided with a display portion for displaying data output from the remote controller.

Note that the television set 1050 is provided with a receiver, a modem, and the like. With the receiver, a general television broadcast can be received. Moreover, when the television set 1050 is connected to a communication network with or without wires via the modem, one-way (from a sender to a receiver) or two-way (between a sender and a receiver or between receivers) data communication can be performed.

Further, the television set 1050 is provided with an external connection terminal 1054, a storage medium recording and reproducing portion 1052, and an external memory slot. The external connection terminal 1054 can be connected to a variety of cables such as a USB cable, and data communication with a personal computer or the like is possible. A disk storage medium is inserted into the storage medium recording and reproducing portion 1052, and data stored in the storage medium can be read and data can be written into the storage medium. In addition, an image, a video, or the like stored as data in an external memory 1056 inserted into the external memory slot can be displayed on the display portion 1053.

When the memory device described in any of the above embodiments is applied to the external memory 1056 or the CPU, the television set 1050 can have high reliability and power consumption thereof can be sufficiently reduced.

The structures, methods, and the like described in this embodiment can be combined as appropriate with any of the structures, methods, and the like described in the other embodiments.

Example

In this example, oxide semiconductor films for a semiconductor device according to one embodiment of the present invention were formed, and the oxide semiconductor films were measured with a transmission electron microscope (TEM) and an atomic force microscope (AFM). The results will be shown.

In this example, Sample A and Sample B were each fabricated in the following manner: a silicon oxynitride film was formed over a glass substrate (AN100 manufactured by Asahi Glass Co., Ltd.) so as to have a thickness of 300 nm, and an oxide semiconductor film (an IGZO film) was formed over the silicon oxynitride film so as to have a thickness of 30 nm.

First, the silicon oxynitride films of Sample A and Sample B were formed by a CVD method. Formation conditions of the silicon oxynitride films were as follows: in a deposition gas, the flow rate of $SiH_4$ was 4 sccm and the flow rate of $N_2O$ was 800 sccm; the pressure was 40 Pa; the substrate temperature was 400° C.; and a high-frequency (RF) power of 150 W was used.

Then, the In—Ga—Zn—O-based oxide semiconductor films of Sample A and Sample B were formed by a sputtering method. The oxide semiconductor films were formed under the following conditions: a target having a composition ratio of $In_2O_3$:$Ga_2O_3$:$ZnO$=1:1:2 [molar ratio] was used; in a deposition gas, the flow rate of Ar was 30 sccm and the flow rate of $O_2$ was 15 sccm; the pressure was 0.4 Pa; the substrate temperature was 400° C.; and a high-frequency (RF) power of 0.5 kW was used.

Heat treatment was performed on Sample A and Sample B, in which the oxide semiconductor films were formed in the above manner, at a heating temperature of 450° C. for 1 hour in a nitrogen atmosphere.

Further, for Sample A, oxygen ($^{18}O$) ions are implanted into the oxide semiconductor film by an ion implantation method. As for conditions of this ion implantation, the accelerating voltage was 10 kV and the dose was $1.0 \times 10^{16}$ ions/$cm^2$.

Figure 16A:
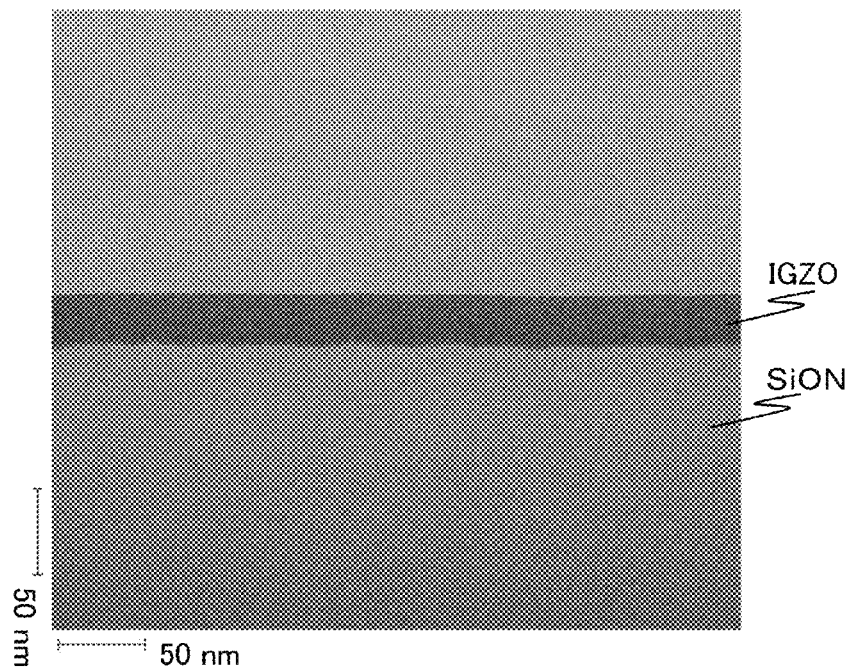
FIGS. 16A and 16B are cross-sectional TEM images of a sample according to one example of the present invention.
Figure 16B:
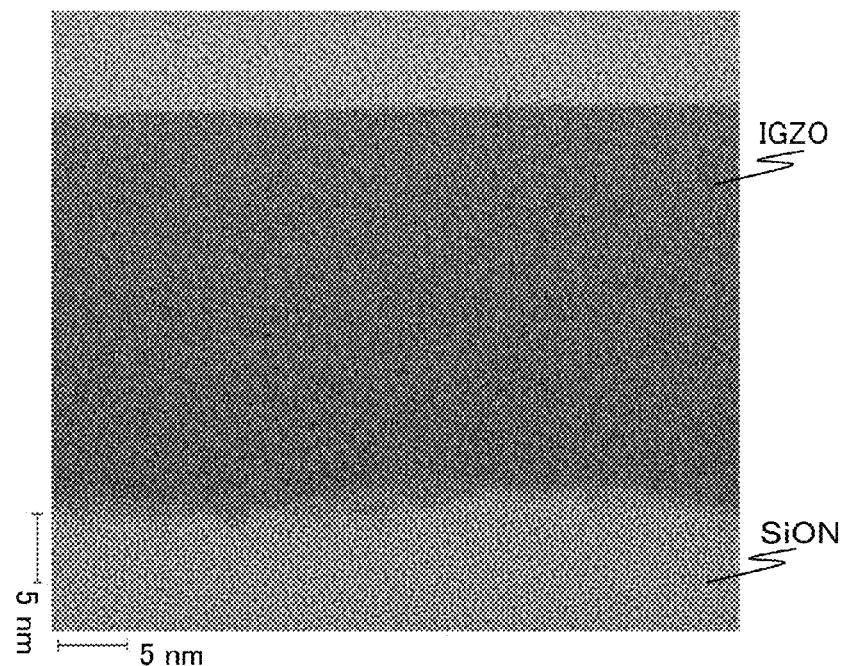
Figure 17:
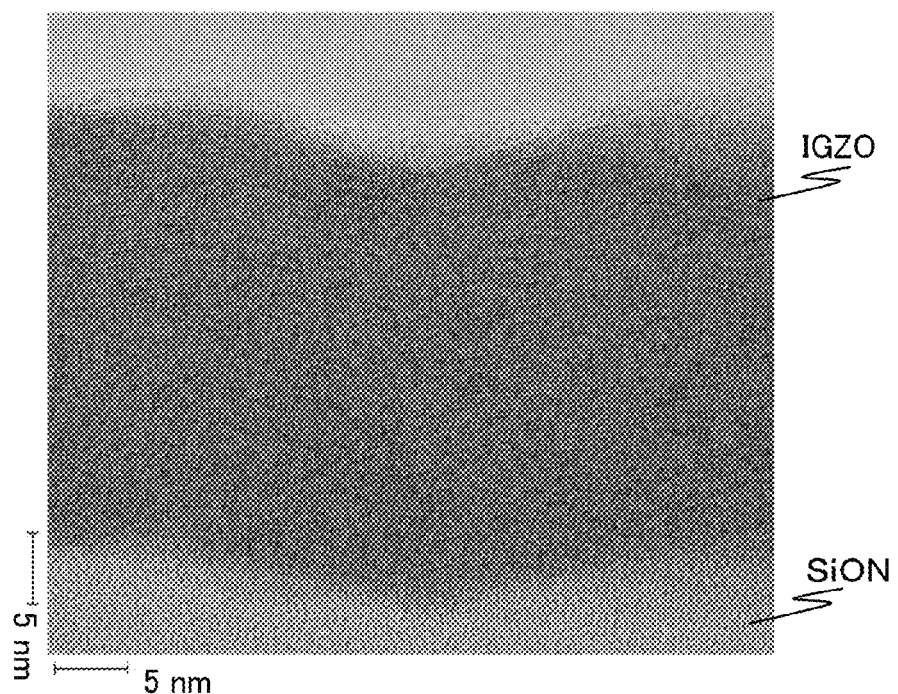
FIG. 17 is a cross-sectional TEM image of a sample according to one example of the present invention.

FIGS. 16A and 16B and FIG. 17 are cross-sectional TEM images of Sample A and Sample B, which were taken with a TEM. FIG. 16A is a cross-sectional TEM image of Sample A at 500000-fold magnification, FIG. 16B is a cross-sectional TEM image of Sample A at 4000000-fold magnification, and FIG. 17 is a cross-sectional TEM image of Sample B at 4000000-fold magnification. The cross-sectional TEM images in this example were taken using H-9000NAR manufactured by Hitachi High-Technologies Corporation, with an accelerating voltage of 300 kV.

As shown in FIGS. 16A and 16B, a surface of the oxide semiconductor film of Sample A has few projections and depressions and high planarity. In contrast, as shown in FIG. 17, a surface of the oxide semiconductor film of Sample B has projections and depressions.

Figure 18A:
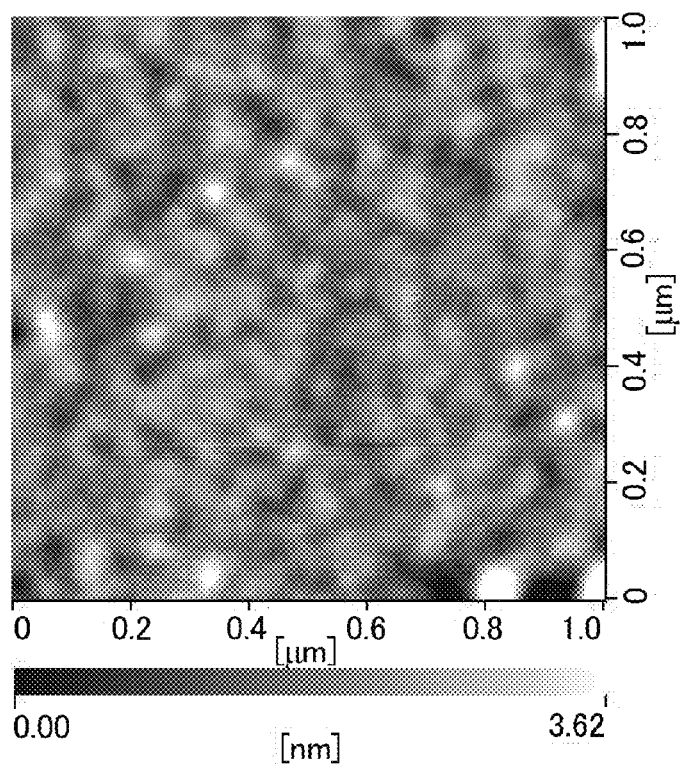
FIGS. 18A and 18B are each an AFM image of a sample according to one example of the present invention.
Figure 18B:
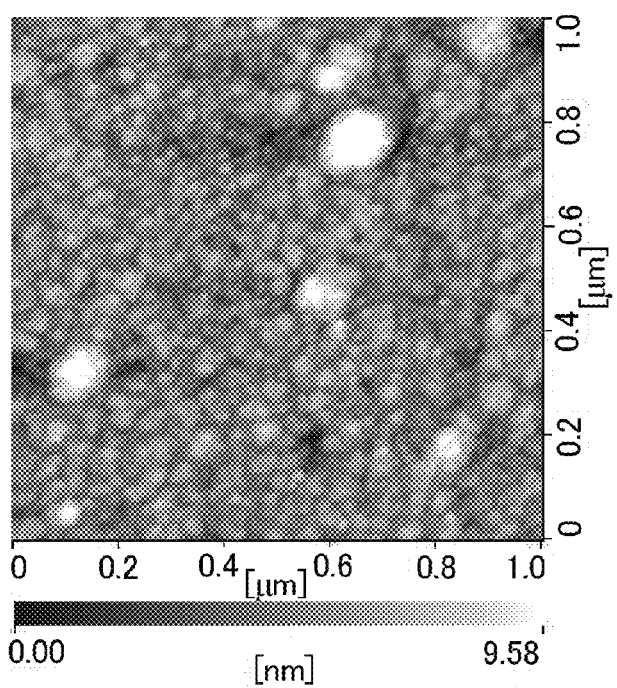

Here, FIGS. 18A and 18B are AFM images of Sample A and Sample B, respectively, which were taken with an AFM. FIG. 18A is an AFM image of Sample A, and FIG. 18B is an AFM image of Sample B. Note that the AFM images in this example were taken with a large stage SPM unit SPA-500 manufactured by SII NanoTechnology Inc. under measurement conditions of a scanning speed of 1.0 Hz and a measurement area of 1 μm×1 μm.

From comparison between the AFM image in FIG. 18A and the AFM image in FIG. 18B, it is found that the surface of the oxide semiconductor film of Sample A has higher planarity than the surface of the oxide semiconductor film of Sample B. Further, average surface roughness was measured using the AFM images in FIGS. 18A and 18B. The average surface roughness of the surface of Sample A was 0.41 nm, and the average surface roughness of the surface of Sample B was 1.08 nm. Thus, it is confirmed that the surface of Sample A has smaller average surface roughness, that is, higher planarity than the surface of Sample B.

The above results indicate that irradiation of an oxide semiconductor film with oxygen ions enables a reduction in the average surface roughness of a surface of the oxide semiconductor film and improvement in the planarity thereof.

In the oxide semiconductor film of Sample B in FIG. 17, layered In—Ga—Zn—O crystals having c-axes perpendicular to the surface of the oxide semiconductor film are observed, whereas such layered In—Ga—Zn—O crystals are not observed in Sample A in FIGS. 16A and 16B. It is presumable from these results that irradiation of an oxide semiconductor film with oxygen ions breaks the structure of layered In—Ga—Zn—O crystals. Note that in the vicinity of the surface of the oxide semiconductor film of Sample B in FIG. 17, the layered In—Ga—Zn—O crystals are formed substantially in parallel to the uneven surface of the oxide semiconductor film.

In this example, an experiment was conducted to examine whether the layered In—Ga—Zn—O crystals, which had been broken by irradiation with oxygen ions, were regenerated or not by performing heat treatment again after the irradiation with oxygen ions.

In this example, Sample C was fabricated in the following manner: a silicon oxide film was formed over a glass substrate (AN100 manufactured by Asahi Glass Co., Ltd.) so as to have a thickness of 300 nm, and an oxide semiconductor film (an IGZO film) was formed over the silicon oxide film so as to have a thickness of 100 nm.

First, the silicon oxide film of Sample C was formed by a sputtering method. Formation conditions of the silicon oxide film were as follows: silicon oxide ($SiO_2$) was used as a target; in a deposition gas, the flow rate of Ar was 25 sccm and the flow rate of $O_2$ was 25 sccm; the pressure was 0.4 Pa; the substrate temperature was 100° C.; and a high-frequency (RF) power of 0.5 kW was used.

Then, the In—Ga—Zn—O-based oxide semiconductor film of Sample C was formed by a sputtering method. The oxide semiconductor film was formed under the following conditions: a target having a composition ratio of $In_2O_3$:$Ga_2O_3$:$ZnO$=1:1:2 [molar ratio] was used; in a deposition gas, the flow rate of Ar was 30 sccm and the flow rate of $O_2$ was 15 sccm; the pressure was 0.4 Pa; the substrate temperature was 250° C.; and a high-frequency (RF) power of 1.5 kW was used.

Heat treatment was performed on Sample C, in which the oxide semiconductor film was formed in the above manner, at a heating temperature of 400° C. for 30 minutes in a vacuum atmosphere.

Further, oxygen ($^{18}O$) ions are implanted into the oxide semiconductor film of Sample C by an ion implantation method. As for conditions of this ion implantation, the accelerating voltage was 40 kV and the dose was $1.0 \times 10^{16}$ ions/$cm^2$.

Then, heat treatment was further performed on Sample C at a heating temperature of 650° C. for 1 hour in a nitrogen atmosphere.

Figure 19A:
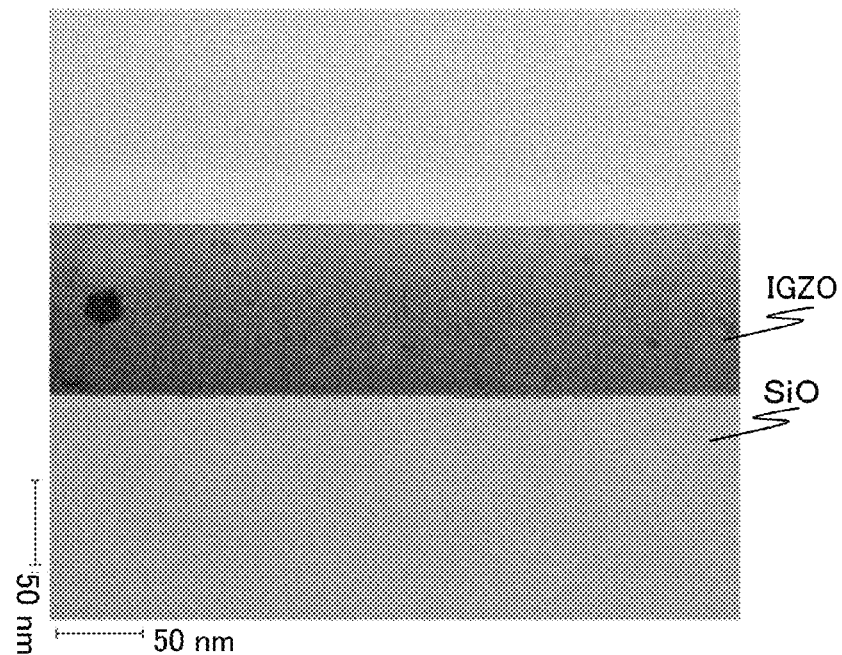
FIGS. 19A and 19B are cross-sectional TEM images of a sample according to one example of the present invention.
Figure 19B:
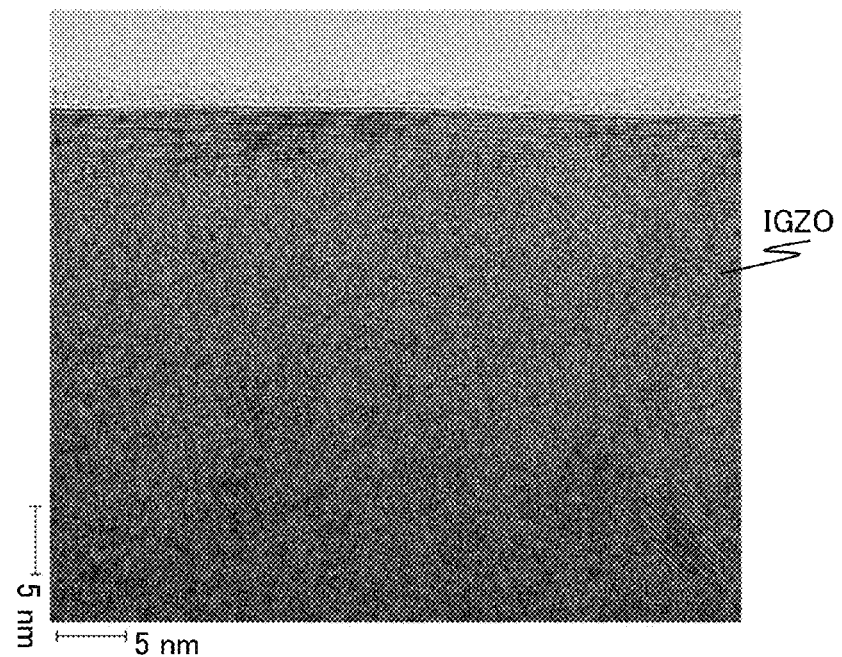

FIGS. 19A and 19B are cross-sectional TEM images of Sample C, which were taken with a TEM. FIG. 19A is a cross-sectional TEM image of Sample C at 500000-fold magnification, and FIG. 19B is a cross-sectional TEM image of Sample C at 4000000-fold magnification.

As shown in FIGS. 19A and 19B, a surface of the oxide semiconductor film of Sample C has few projections and depressions and high planarity. In addition, in FIG. 19B, layered In—Ga—Zn—O crystals having c-axes perpendicular to the surface of the oxide semiconductor film are observed in a range from the surface of the oxide semiconductor film to approximately 2 nm to 5 nm in depth.

Further, in the vicinity of the surface of the oxide semiconductor film of Sample C in FIGS. 19A and 19B, the layered In—Ga—Zn—O crystals are formed substantially in parallel to the highly planarized surface of the oxide semiconductor film. The results indicate that, in the case where the oxide semiconductor film of Sample C is used for a transistor, the mobility of the transistor can be improved because the In—Ga—Zn—O crystals for a channel formation region in the oxide semiconductor film of Sample C are more highly aligned in the channel direction in a layered manner than those in the oxide semiconductor film of Sample B.

Here, Sample D was fabricated in such a manner that an oxide semiconductor film was formed by a method similar to that for Sample A and then was subjected to heat treatment at a heating temperature of 650° C. for 1 hour in a nitrogen atmosphere. An AFM image of Sample D is shown in FIG. 20.

Figure 20:
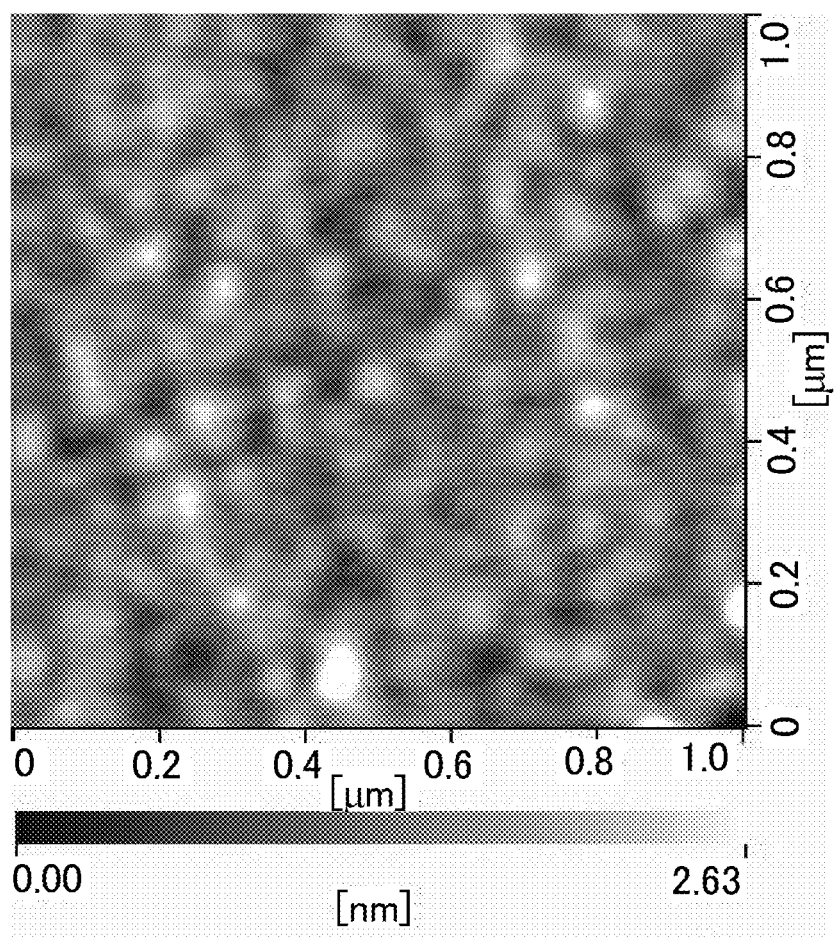
FIG. 20 is an AFM image of a sample according to one example of the present invention.

From the AFM image in FIG. 20, it is found that a surface of the oxide semiconductor film of Sample D has high planarity as in the case of the AFM image in FIG. 18A. Further, average surface roughness was measured using the AFM image in FIG. 20. The average surface roughness of the surface of Sample D was 0.31 nm, which is better than the average surface roughness of the surface of Sample A. Thus, it is confirmed that Sample D has small average surface roughness, that is, high planarity.

It is confirmed from the above results that layered In—Ga—Zn—O crystals, which has been broken by irradiation with oxygen ions, are regenerated by performing heat treatment again after the irradiation with oxygen ions. It is also confirmed that when the layered In—Ga—Zn—O crystals are regenerated, the planarity of the oxide semiconductor film, which has been improved by the irradiation with oxygen ions, is maintained or improved.

In this manner, by irradiating an oxide semiconductor film with oxygen ions so that average surface roughness of a surface thereof is reduced, an increase in leakage current and power consumption of a transistor formed using the oxide semiconductor film can be suppressed even when the thickness of a gate insulating film is reduced for miniaturization. Accordingly, a miniaturized semiconductor device in which an increase in power consumption is suppressed can be provided.

Further, by performing heat treatment on the oxide semiconductor film whose average surface roughness has been reduced, the oxide semiconductor film can include a crystal having a c-axis substantially perpendicular to the surface of the oxide semiconductor film. Consequently, a change in electric characteristics of the oxide semiconductor film due to irradiation with visible light or ultraviolet light can be suppressed. Accordingly, a highly reliable semiconductor device having stable electric characteristics can be provided.

This application is based on Japanese Patent Application serial no. 2011-134236 filed with the Japan Patent Office on Jun. 16, 2011, the entire contents of which are hereby incorporated by reference.

What is claimed is:

1. A method for manufacturing a semiconductor device comprising the steps of:
    forming an oxide semiconductor film over an insulating surface;
    irradiating the oxide semiconductor film with an oxygen ion so that an average surface roughness of a surface of the oxide semiconductor film is reduced;
    forming a gate insulating film over the oxide semiconductor film after irradiating the oxide semiconductor film with the oxygen ion;
    forming a gate electrode over the gate insulating film so as to overlap with the oxide semiconductor film; and
    performing heat treatment on the oxide semiconductor film after the irradiation of the oxide semiconductor film with the oxygen ion so that the oxide semiconductor film including a crystal having a c-axis substantially perpendicular to the surface of the oxide semiconductor film is formed.

2. The method for manufacturing a semiconductor device according to claim 1,
    wherein the average surface roughness of the surface of the oxide semiconductor film is made greater than or equal to 0.1 nm and less than or equal to 0.6 nm by the irradiation of the oxygen ion.

3. The method for manufacturing a semiconductor device according to claim 1,
    wherein the irradiation with the oxygen ion is performed by an ion implantation method.

4. The method for manufacturing a semiconductor device according to claim 1,
    wherein the irradiation with the oxygen ion is performed by an ion doping method.

5. The method for manufacturing a semiconductor device according to claim 1,
    wherein the irradiation with the oxygen ion is performed by a plasma immersion ion implantation method.

6. The method for manufacturing a semiconductor device according to claim 1,
    wherein the irradiation is performed with a gas cluster ion beam including the oxygen ion.

7. The method for manufacturing a semiconductor device according to claim 1,
    wherein the crystal having a c-axis substantially perpendicular to the surface of the oxide semiconductor film is provided in a range from the surface of the oxide semiconductor film to 5 nm in depth.

8. The method for manufacturing a semiconductor device according to claim 1,
    wherein a thickness of the gate insulating film is greater than or equal to 5 nm and less than or equal to 15 nm.

9. A method for manufacturing a semiconductor device comprising the steps of:
    forming an oxide semiconductor film over an insulating surface;
    irradiating the oxide semiconductor film with a fluorine ion so that an average surface roughness of a surface of the oxide semiconductor film is reduced;
    forming a gate insulating film over the oxide semiconductor film after irradiating the oxide semiconductor film with the fluorine ion;
    forming a gate electrode over the gate insulating film so as to overlap with the oxide semiconductor film; and performing heat treatment on the oxide semiconductor film after the irradiation of the oxide semiconductor film with the fluorine ion so that fluorine is released from the oxide semiconductor film and the oxide semiconductor film including a crystal having a c-axis substantially perpendicular to the surface of the oxide semiconductor film is formed.

10. The method for manufacturing a semiconductor device according to claim 9,
wherein the average surface roughness of the surface of the oxide semiconductor film is made greater than or equal to 0.1 nm and less than or equal to 0.6 nm by the irradiation of the fluorine ion.

11. The method for manufacturing a semiconductor device according to claim 9,
wherein the irradiation with the fluorine ion is performed by an ion implantation method.

12. The method for manufacturing a semiconductor device according to claim 9,
wherein the irradiation with the fluorine ion is performed by an ion doping method.

13. The method for manufacturing a semiconductor device according to claim 9,
wherein the irradiation with the fluorine ion is performed by a plasma immersion ion implantation method.

14. The method for manufacturing a semiconductor device according to claim 9,
wherein the irradiation is performed with a gas cluster ion beam including the fluorine ion.

15. The method for manufacturing a semiconductor device according to claim 9,
wherein the crystal having a c-axis substantially perpendicular to the surface of the oxide semiconductor film is provided in a range from the surface of the oxide semiconductor film to 5 nm in depth.

16. The method for manufacturing a semiconductor device according to claim 9,
wherein a thickness of the gate insulating film is greater than or equal to 5 nm and less than or equal to 15 nm.

17. A method for manufacturing a semiconductor device comprising the steps of:
forming an oxide semiconductor film over an insulating surface;
performing plasma treatment on the oxide semiconductor film in an oxygen atmosphere so that an average surface roughness of a surface of the oxide semiconductor film is reduced;
forming a gate insulating film over the oxide semiconductor film after performing plasma treatment on the oxide semiconductor film;
forming a gate electrode over the gate insulating film so as to overlap with the oxide semiconductor film; and
performing heat treatment on the oxide semiconductor film after the plasma treatment of the oxide semiconductor film in the oxygen atmosphere so that the oxide semiconductor film including a crystal having a c-axis substantially perpendicular to the surface of the oxide semiconductor film is formed.

18. The method for manufacturing a semiconductor device according to claim 17,
wherein the average surface roughness of the surface of the oxide semiconductor film is made greater than or equal to 0.1 nm and less than or equal to 0.6 nm by performing the plasma treatment.

19. The method for manufacturing a semiconductor device according to claim 17,
wherein the crystal having a c-axis substantially perpendicular to the surface of the oxide semiconductor film is in a range from the surface of the oxide semiconductor film to 5 nm in depth.

20. The method for manufacturing a semiconductor device according to claim 17,
wherein a thickness of the gate insulating film is greater than or equal to 5 nm and less than or equal to 15 nm.

* * * * *